United States Patent
Yamada et al.

(10) Patent No.: US 9,354,128 B2
(45) Date of Patent: *May 31, 2016

(54) RESONATOR ELEMENT, RESONATOR, OSCILLATOR, ELECTRONIC APPARATUS, SENSOR, AND MOBILE OBJECT

(71) Applicant: SEIKO EPSON CORPORATION, Tokyo (JP)

(72) Inventors: Akinori Yamada, Ina (JP); Shuhei Yoshida, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/582,629

(22) Filed: Dec. 24, 2014

(65) Prior Publication Data

US 2015/0188513 A1 Jul. 2, 2015

(30) Foreign Application Priority Data

Dec. 27, 2013 (JP) ................................. 2013-273529

(51) Int. Cl.
| | |
|---|---|
| *H03H 9/21* | (2006.01) |
| *G01L 1/10* | (2006.01) |
| *H03H 9/05* | (2006.01) |
| *H03H 9/10* | (2006.01) |
| *H03H 9/215* | (2006.01) |
| *H03H 3/02* | (2006.01) |

(52) U.S. Cl.
CPC .............. *G01L 1/106* (2013.01); *H03H 9/0547* (2013.01); *H03H 9/1014* (2013.01); *H03H 9/215* (2013.01); *H03H 2003/026* (2013.01)

(58) Field of Classification Search
CPC .... H03H 9/0547; H03H 9/1014; H03H 9/215
USPC ........................................... 331/156; 310/370
See application file for complete search history.

(56) References Cited

U.S. PATENT DOCUMENTS

| | | |
|---|---|---|
| 8,427,035 B2 | 4/2013 | Yamada |
| 2003/0067248 A1 | 4/2003 | Dalla Piazza et al. |
| 2005/0062368 A1 | 3/2005 | Hirasawa et al. |
| 2010/0164331 A1 | 7/2010 | Yamada |
| 2010/0171397 A1 | 7/2010 | Yamada |
| 2010/0244989 A1 | 9/2010 | Furuhata et al. |
| 2011/0018399 A1 | 1/2011 | Murata et al. |
| 2011/0109205 A1* | 5/2011 | Yamada .................. H01L 41/08 310/370 |
| 2011/0227672 A1 | 9/2011 | Yamada |
| 2014/0167870 A1 | 6/2014 | Yamada |

FOREIGN PATENT DOCUMENTS

| | | |
|---|---|---|
| EP | 1732 217 A1 | 12/2006 |
| EP | 1732 220 A1 | 12/2006 |
| EP | 2071 721 A1 | 6/2009 |
| JP | 2002141770 A | 5/2002 |

(Continued)

*Primary Examiner* — Joseph Chang
(74) *Attorney, Agent, or Firm* — Oliff PLC

(57) ABSTRACT

A resonator element satisfies, when a shortest distance between a first end portion and a second end portion of a base is Wb [m], an effective width of the base in a Y axis direction is We [m], and a Q value of the resonator element is Q, the following expressions (A) and (B).

$$Q=\{(\rho \cdot Cp)/(c \cdot \alpha^2 \cdot \Theta)\} \times [\{1+(2 \cdot \rho \cdot Cp \cdot We^2 \cdot f/(\pi \cdot k))^2\}/(2 \cdot \rho \cdot Cp \cdot We^2 \cdot f/(\pi \cdot k))] \quad (A)$$

$$0.81 \leq Wb/We \leq 1.70 \quad (B)$$

20 Claims, 27 Drawing Sheets

(56) References Cited

FOREIGN PATENT DOCUMENTS

| | | |
|---|---|---|
| JP | 2003-163568 A | 6/2003 |
| JP | 2006-345517 A | 12/2006 |
| JP | 2006-345519 A | 12/2006 |
| JP | 2008-177723 A | 7/2008 |
| JP | 2009-147935 A | 7/2009 |
| JP | 2009-164775 A | 7/2009 |
| JP | 2010-119128 A | 5/2010 |
| JP | 2010157933 A | 7/2010 |
| JP | 2010-183138 A | 8/2010 |
| JP | 2010171965 A | 8/2010 |
| JP | 2010171966 A | 8/2010 |
| JP | 2010178064 A | 8/2010 |
| JP | 2010-226608 A | 10/2010 |
| JP | 2010-226610 A | 10/2010 |
| JP | 2010-252302 A | 11/2010 |
| JP | 2010-278831 A | 12/2010 |
| JP | 2011-015101 A | 1/2011 |
| JP | 2011-019159 A | 1/2011 |
| JP | 2011-124976 A | 6/2011 |
| JP | 2011-193436 A | 9/2011 |
| JP | 2011-199331 A | 10/2011 |
| JP | 2012-135021 A | 7/2012 |
| JP | 2012-147329 A | 8/2012 |
| JP | 2012-186679 A | 9/2012 |
| JP | 2012-227961 A | 11/2012 |
| JP | 2014-121039 A | 6/2014 |
| WO | 2009/116523 A1 | 9/2009 |

* cited by examiner

| Wb [μm] | f [kHz] | Q | We [μm] | Wb / We |
|---|---|---|---|---|
| 25.0 | 20.101 | 1,484 | 34.0 | 0.74 |
| 35.0 | 25.382 | 3,434 | 47.6 | 0.73 |
| 40.0 | 27.104 | 4,639 | 53.8 | 0.74 |
| 50.0 | 29.359 | 6,672 | 62.1 | 0.81 |
| 60.0 | 30.643 | 7,867 | 66.0 | 0.91 |
| 70.0 | 31.401 | 8,467 | 67.6 | 1.03 |
| 80.0 | 31.873 | 8,823 | 68.5 | 1.17 |
| 90.0 | 32.176 | 8,888 | 68.5 | 1.31 |
| 100.0 | 32.381 | 8,952 | 68.5 | 1.46 |
| 150.0 | 32.793 | 9,011 | 68.3 | 2.20 |
| 200.0 | 32.895 | 9,018 | 68.2 | 2.93 |

FIG. 7

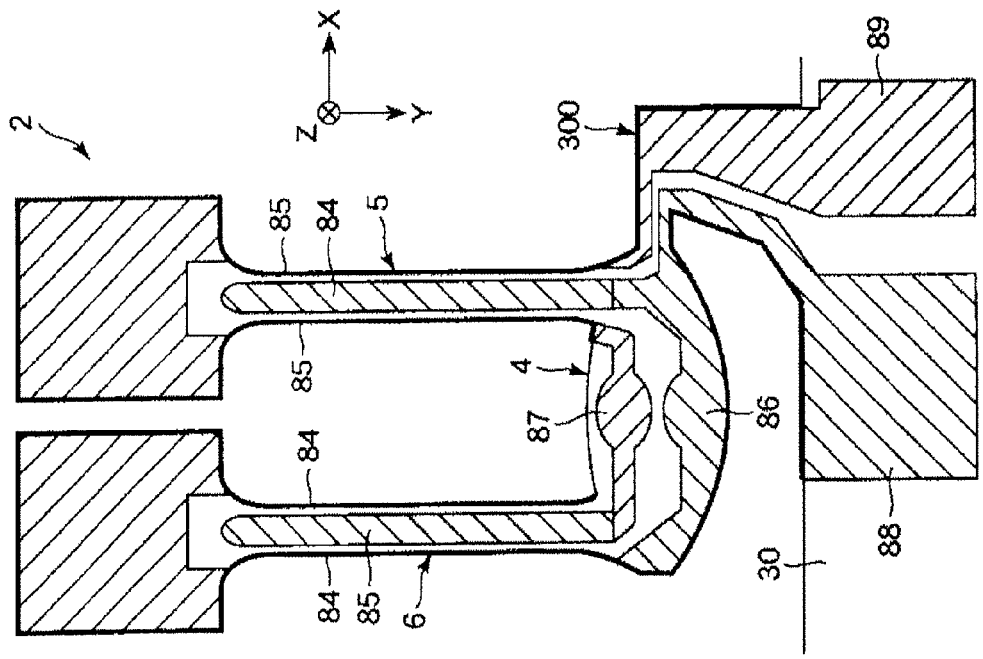
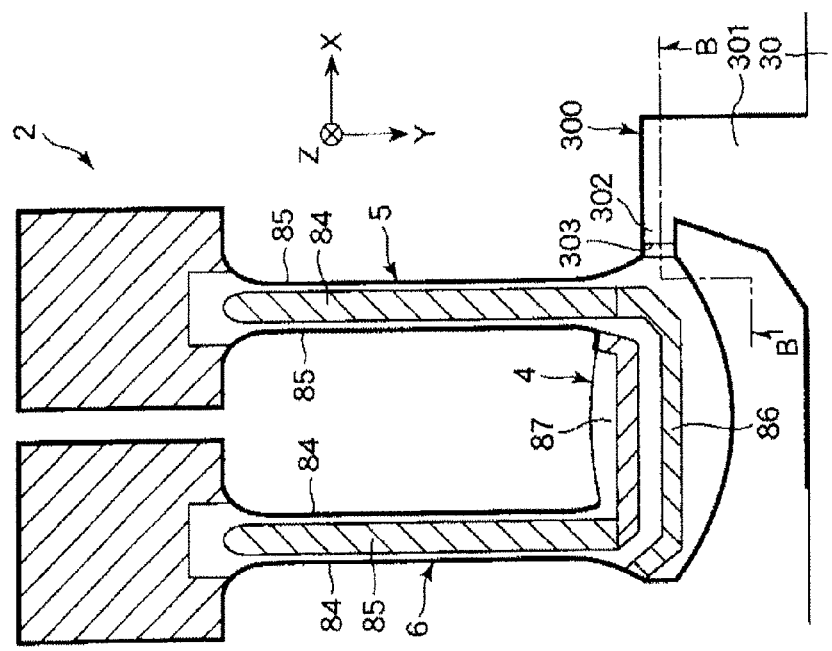
FIG. 10B
FIG. 10A

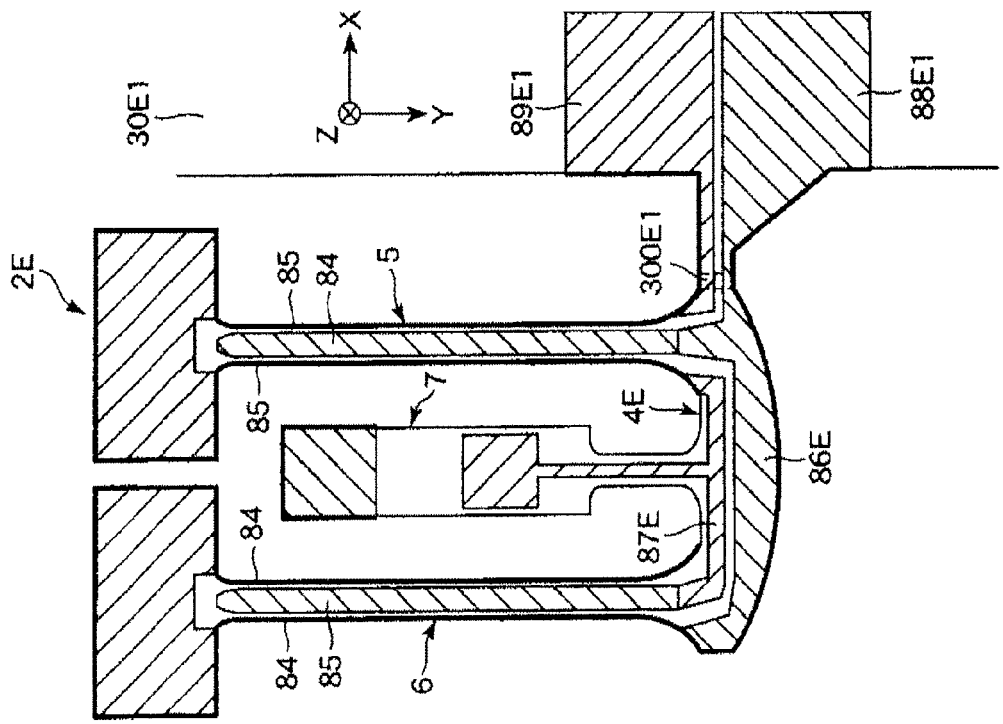
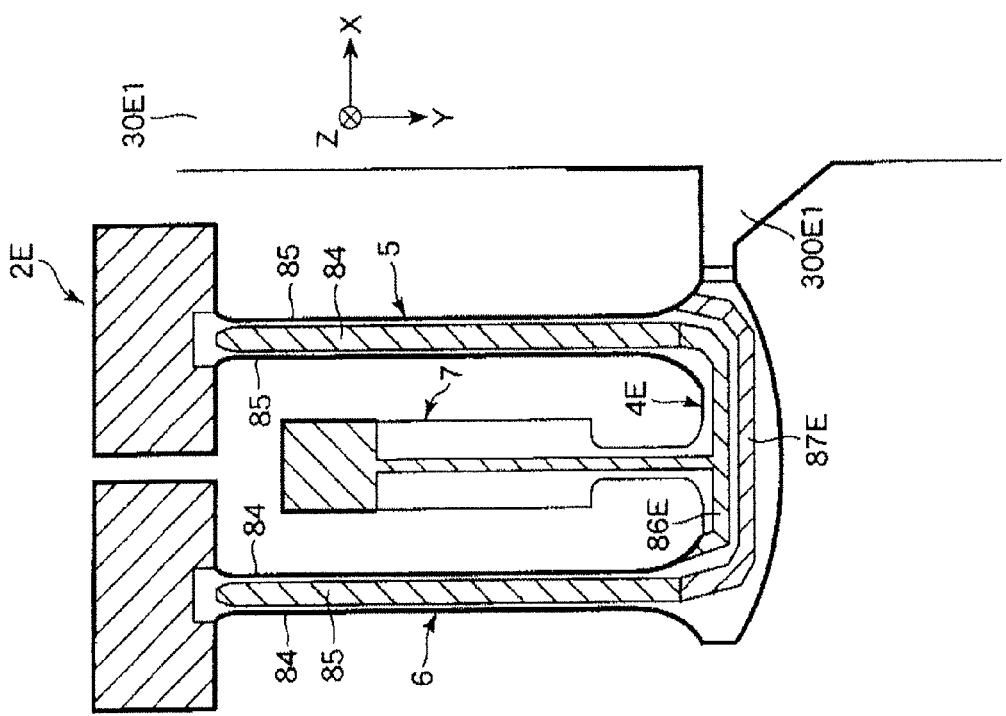
FIG. 19B
FIG. 19A

RESONATOR ELEMENT, RESONATOR, OSCILLATOR, ELECTRONIC APPARATUS, SENSOR, AND MOBILE OBJECT

BACKGROUND

1. Technical Field

The present invention relates to a resonator element, a resonator, an oscillator, an electronic apparatus, a sensor, and a mobile object.

2. Related Art

For example, in a small information apparatus such as a hard disk drive (HDD), a mobile computer or an IC card, or in a mobile object communication apparatus such as a mobile phone, a car phone or a paging system, an electronic device such as a resonator or an oscillator is widely used.

A general resonator element used in such an electronic device includes a base, and a pair of vibrating arms that extends from the base. Such a resonator element is normally obtained by etching a wafer made of quartz crystal or the like to form an appearance with a part of the base being connected to a base material through a breaking portion, and then, by breaking the breaking portion.

For example, in a resonator element disclosed in JP-A-2010-278831, a breaking portion is disposed in an end portion of a base on a side opposite to a vibrating arm. Further, in a resonator element disclosed in JP-A-2008-177723, a breaking portion is disposed in both end portions of a base in a direction where a pair of vibrating arms is arranged.

Recently, as miniaturization of various apparatuses provided with such a resonator element, miniaturization of the resonator element is also requested as much as possible. Particularly, it is desirable to shorten the length of the resonator element along a direction where the vibrating arms extend.

However, in the resonator elements disclosed in JP-A-2010-278831 and JP-A-2008-177723, it is difficult to achieve sufficient miniaturization, and if the length of the base in the extension direction of the vibrating arms is simply shortened, thermoelastic loss increases.

Particularly, in the resonator element disclosed in JP-A-2010-278831, since a concave portion is formed in the vicinity of a root of the breaking portion of the base, if the length of the base along the extension direction of the vibrating arms is shortened, a portion where the length of the base is shortened more than necessary due to the presence of the concave portion is formed, and consequently, the thermoelastic loss increases. The reason is as follows: That is, the base having the length shortened along the extension direction of the vibrating arms performs flexural vibration when the pair of vibrating arms performs flexural vibration, deformation of extension and contraction or contraction and extension occurs in a peripheral region of one end portion where the vibrating arms are connected and in a peripheral region of the other end portion opposite to the one end portion, and thus, a temperature decrease occurs in a region where the extension occurs and a temperature increase occurs in a region where the contraction occurs. Thus, energy capable of being mechanically used is reduced due to heat flow caused due to a temperature difference. Further, in the resonator element disclosed in JP-A-2010-278831, if the length of the base along the extension direction of the vibrating arms is shortened, when the vibrating arms perform the flexural vibration, distortion is concentrated on the concave portion, and accordingly, heat flow increases due to increase of a temperature change of the base. Consequently, the thermoelastic loss also increases. In addition, in the resonator element disclosed in JP-A-2010-278831, if the length of the base along the extension direction of the vibrating arms is shortened, when shock is applied from the outside, stress concentrates on the concave portion, which may be a starting point of breakage.

SUMMARY

An advantage of some aspects of the invention is to provide a resonator element capable of reducing thermoelastic loss while achieving miniaturization of the resonator element in an extension direction of vibrating arms, and a resonator, an oscillator, an electronic apparatus, a sensor, and a mobile object provided with the resonator element.

The invention can be implemented as the following forms or application examples.

Application Example 1

This application example is directed to a resonator element including: a base that includes a first end portion and a second end portion disposed opposite to the first end portion in a planar view; and a pair of vibrating arms that extends from the first end portion in a first direction and is arranged in a second direction intersecting with the first direction in the planar view, in which a protruding portion is provided in at least one end portion between a third end portion and a fourth end portion that are respectively disposed at opposite ends of the base in the second direction in the planar view, and when a shortest distance between the first end portion and the second end portion is Wb [m], an effective width of the base in the first direction is We [m], and a Q value of the resonator element is Q, the following expressions (A) and (B) are satisfied.

$$Q=\{(\rho \cdot Cp)/(c \cdot \alpha^2 \cdot \Theta)\} \times [\{1+(2 \cdot \rho Cp \cdot We^2 \cdot f/(\pi \cdot k))^2\}/(2 \cdot \rho \cdot Cp \cdot We^2 \cdot f/(\pi \cdot k))] \quad (A)$$

$$0.81 \le Wb/We \le 1.70 \quad (B)$$

(where in expression (A), f represents a vibration frequency [Hz] of the resonator element, $\rho$ is mass density [kg/m$^3$], Cp is thermal capacity [J/(kg·K)], c is an elastic constant [N/m$^2$] in a direction orthogonal to the direction of Wb in a plane, $\alpha$ is a thermal expansion coefficient [1/K] in the direction orthogonal to the direction of Wb in the plane, $\Theta$ is environmental temperature[K], and k is thermal conductivity [W/(m·K)] in the direction of Wb.)

With such a configuration, when Wb/We satisfies a relationship of 0.81≤Wb/We≤1.70, it is possible to reduce thermoelastic loss due to miniaturization of the base. Thus, it is possible to reduce thermoelastic loss while achieving miniaturization in the extension direction of the vibrating arms.

Application Example 2

In the resonator element according to the application example described above, it is preferable that a relationship of 0.91≤Wb/We≤1.30 is satisfied.

With such a configuration, it is possible to reduce thermoelastic loss due to miniaturization of the base. Thus, it is possible to reduce thermoelastic loss while achieving miniaturization in the extension direction of the vibrating arms.

Application Example 3

In the resonator element according to the application example described above, it is preferable that a relationship of 1.00≤Wb/We≤1.20 is satisfied.

With such a configuration, it is possible to reduce thermoelastic loss due to miniaturization of the base. Thus, it is possible to reduce thermoelastic loss while achieving miniaturization in the extension direction of the vibrating arms.

Application Example 4

In the resonator element according to the application example described above, it is preferable that the resonator element further includes a supporting arm that extends from the base.

With such a configuration, it is possible to suppress vibration leakage generated by the flexural vibration of the vibrating arms. Thus, it is possible to obtain a resonator element having a high Q value.

Application Example 5

In the resonator element according to the application example described above, it is preferable that the supporting arm is disposed between one pair of vibrating arms in the planar view.

With such a configuration, since a portion that supports and fixes the resonator element is present at a central portion of the resonator element, it is possible to shorten the entire length of the resonator element, to thereby achieve miniaturization of the resonator element.

Application Example 6

In the resonator element according to the application example described above, it is preferable that the vibrating arm includes a weight portion and an arm portion disposed between the weight portion and the base in the planar view.

With such a configuration, it is possible to shorten the length of the vibrating arms, and consequently, to shorten the entire length of the resonator element. Further, it is possible to increase the width of the arm portion, to thereby reduce thermoelastic loss.

Application Example 7

In the resonator element according to the application example described above, it is preferable that the weight portion has a width in the second direction wider than that of the arm portion.

With such a configuration, it is possible to effectively increase the mass of the weight portion. Thus, it is possible to efficiently achieve miniaturization of the resonator element and reduction of thermoelastic loss.

Application Example 8

In the resonator element according to the application example described above, it is preferable that when a virtual line that passes through the center between one pair of vibrating arms along the first direction in the planar view is set, a distance between the virtual line and a tip end of the protruding portion is shorter than a distance between the virtual line and an end portion of the weight portion opposite to the virtual line in the second direction.

With such a configuration, it is possible to set a protrusion amount of the protruding portion from the base in the second direction to be smaller than a protrusion amount of the weight portion from the base in the second direction. Thus, it is possible to provide the protruding portion without increase of the maximum size in the second direction.

Application Example 9

This application example is directed to a resonator including: the resonator element according to the application example described above; and a container to which the resonator element is attached.

With such a configuration, it is possible to provide a resonator having excellent characteristics with a small size.

Application Example 10

In the resonator according to the application example described above, it is preferable that the resonator element is attached to the container using an adhesive or a bump.

The resonator element attached to the container in this way is advantageous in view of miniaturization compared with a case where the resonator element is connected through a lead terminal. Accordingly, by applying the invention to the resonator including such a resonator element, it is possible to achieve excellent characteristics with a small size.

Application Example 11

This application example is directed to an oscillator including: the resonator element according to the application example described above; and a circuit.

With such a configuration, it is possible to provide an oscillator having excellent characteristics with a small size.

Application Example 12

This application example is directed to an electronic apparatus including the resonator element according to the application example described above.

With such a configuration, it is possible to provide an electronic apparatus having excellent reliability.

Application Example 13

This application example is directed to a sensor including the resonator element according to the application example described above.

With such a configuration, it is possible to provide a sensor having excellent characteristics with a small size.

Application Example 14

This application example is directed to a mobile object including: the resonator element according to the application example described above.

With such a configuration, it is possible to provide a mobile object having excellent reliability.

BRIEF DESCRIPTION OF THE DRAWINGS

The invention will be described with reference to the accompanying drawings, wherein like numbers reference like elements.

FIG. 7 is a table illustrating conditions and results of a simulation analysis.

FIGS. 10A and 10B are a top view and a bottom (perspective) view illustrating an electrode configuration and a breaking portion of the resonator element shown in FIG. 1.

FIGS. 19A and 19B are a top view and a bottom (perspective) view illustrating the electrode configuration and breaking portion of the resonator element shown in FIG. 15.

DESCRIPTION OF EXEMPLARY EMBODIMENTS

Hereinafter, a resonator element, a resonator, an oscillator, an electronic apparatus, a sensor, and a mobile object according to the invention will be described with reference to the accompanying drawings.

1. Resonator Element

First Embodiment

Figure 1:
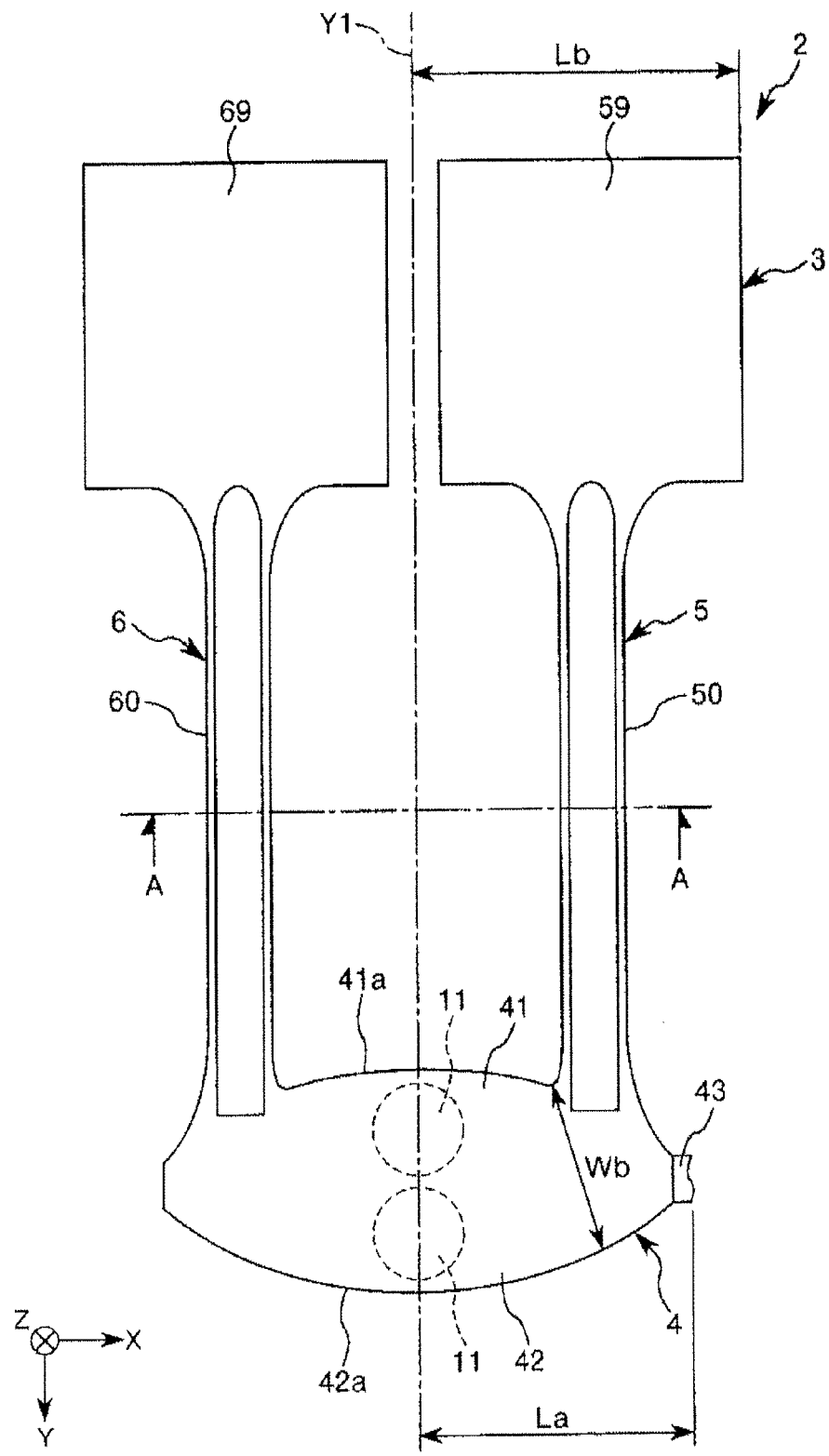
FIG. 1 is a plan view (top view) illustrating a resonator element according to a first embodiment of the invention.
Figure 2:
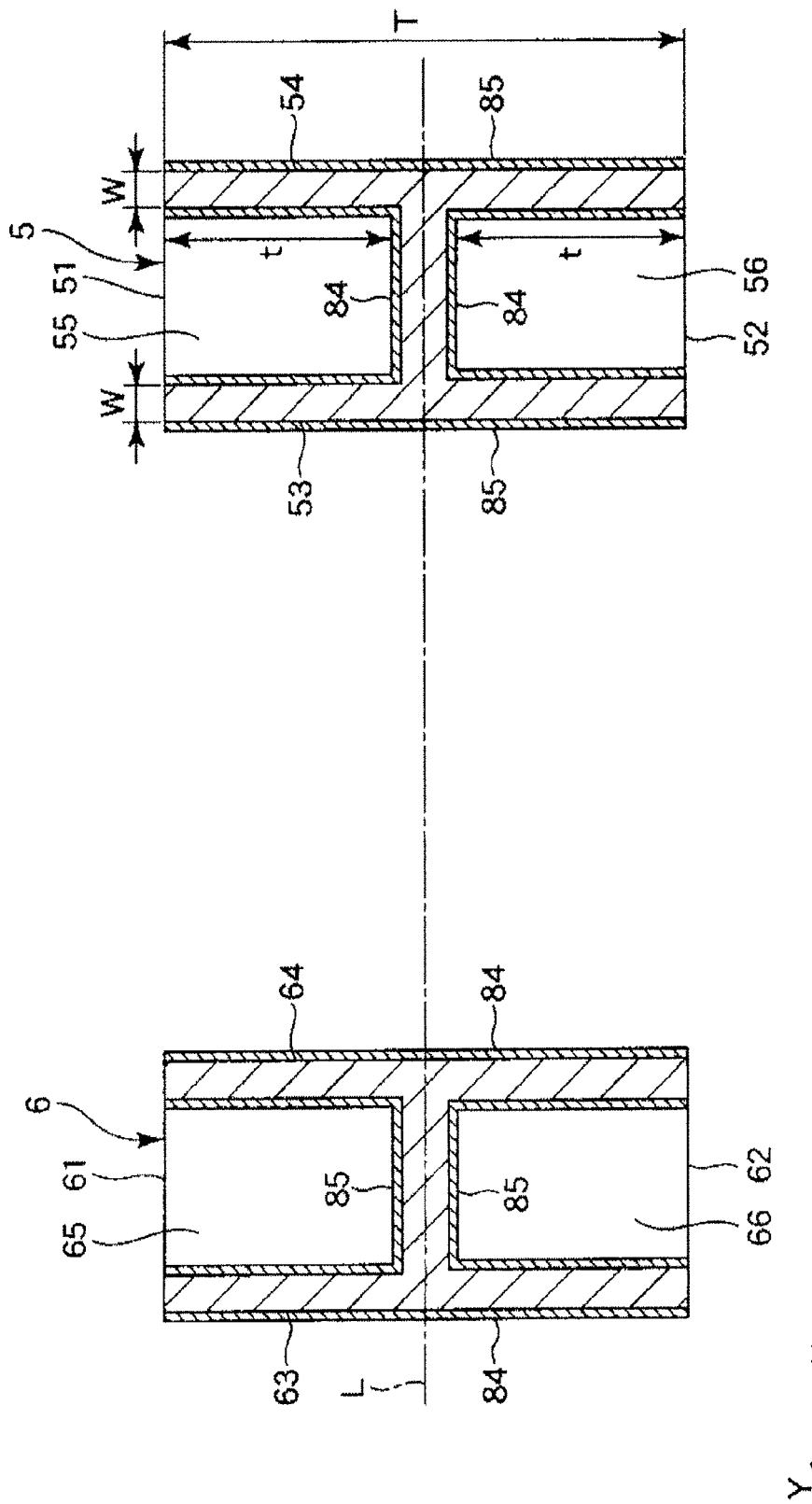
FIG. 2 is a sectional view taken along line A-A in FIG. 1.

FIG. 1 is a plan view (top view) illustrating a resonator element according to the first embodiment of the invention, and FIG. 2 is a sectional view taken along line A-A in FIG. 1.

In the respective drawings, for ease of description, an X axis, a Y axis, and a Z axis are appropriately shown as three axes that are orthogonal to each other, in which the X axis, the Y axis, and the Z axis respectively correspond to an X axis (electric axis), a Y axis (mechanical axis), and a Z axis (optical axis) which are crystal axes of quartz crystal. Further, in the following description, a direction (second direction) parallel to the X axis is referred to as an "X axis direction", a direction (first direction) parallel to the Y axis direction is referred to as a "Y axis direction", and a direction (third direction) parallel to the Z axis direction is referred to as a "Z axis direction". Further, each tip end side of arrows of the X axis, the Y axis, and the Z axis shown in the respective figures represents "+", and each base end side thereof represents "−". In addition, a −Z axis direction side represents "up", and a +Z axis direction side represents "down". Furthermore, in the following description, for ease of description, a planar view when seen from the Z axis direction is simply referred to as a "planar view".

A resonator element 2 shown in FIG. 1 includes a quartz crystal substrate 3 including a base 4 and a pair of vibrating arms 5 and 6. Further, although not shown in FIG. 1, the resonator element 2 includes a first drive electrode 84 and a second drive electrode 85 formed on the quartz crystal substrate 3 (see FIG. 2).

The quartz crystal substrate 3 is formed by a Z-cut quartz crystal plate. Thus, the resonator element 2 can show an excellent vibration characteristic. The Z-cut quartz crystal plate refers to a quartz crystal substrate in which the Z axis (optical axis) of quartz crystal corresponds to a thickness direction. It is preferable that the Z axis of the quartz crystal coincides with the thickness direction of the quartz crystal substrate 3, but the Z axis of the quartz crystal is slightly (for example, by an angle less than approximate) 15°) tilted with respect to the thickness direction in terms of reduction of a frequency temperature change in the vicinity of ordinary temperature.

As shown in FIG. 1, the quartz crystal substrate 3 includes the base 4, and the pair of vibrating arms 5 and 6 that extend from the base 4.

The base 4 forms a plate shape that extends along an XY plane which is a plane parallel to the X axis and the Y axis, in which the Z axis direction is a thickness direction. The base 4 is configured so that a surface thereof on the +Z axis direction side is fixed and supported to a package (not shown) through a pair of bonding materials 11.

The base 4 includes a width reduction portion 41 provided in an end portion on the −Y axis direction side, and a width reduction portion 42 provided in an end portion on the +Y axis direction side. When a virtual line Y1 that passes through the center of the pair of vibrating arms 5 and 6 along the Y axis direction is set, the widths of the width reduction portions 41 and 42 in the X axis direction are gradually reduced toward the virtual line Y1 as they become distant from a central part of the base 4. In the present embodiment, outer edges (that is, a first end surface 41a directed in the −Y axis direction, and a second end surface 42a directed in the +Y axis direction) of the width reduction portions 41 and 42 are formed in a curved surface shape. Specifically, the outer edges of the width reduction portions 41 and 42 are formed in a circular-arc shape having a specific curvature and having a center set on the virtual line Y1.

When the quartz crystal is etched, the outer edges are microscopically shown to have a shape in which short straight lines are continuously connected, but in this case, it is assumed that the outer edges are formed in a curved surface shape. The width reduction portions 41 and 42 may be provided as necessary, and at least one thereof may not be provided.

Further, an outline of the width reduction portions of the resonator element according to the embodiment of the invention is not limited to a curved or a straight inclination portion in the planar view, and may be formed in a step shape having plural step differences.

The vibrating arms 5 and 6 respectively extend from the first end surface 41a of the base 4 in the −Y axis direction to be aligned in parallel in the X axis direction. The vibrating arms 5 and 6 are respectively formed in an elongated shape, in which a base end on the side of the base 4 is a fixed end and a tip end that extends in the −Y axis direction from the base end is a free end. Further, hammer heads (weight portions) 59 and 69 which are weights are provided in the tip end portions of the vibrating arms 5 and 6. A frequency adjustment metal layer may be provided in the hammer heads 59 and 69.

As shown in FIG. 2, the vibrating arm 5 includes a pair of main surfaces 51 and 52 that is formed on the XY plane and forms a front-and-back relationship, and a pair of side surfaces 53 and 54 that is formed on the YZ plane and connects the pair of main surfaces 51 and 52. Further, the vibrating arm 5 includes a bottomed groove 55 opened to the main surface 51, and a bottomed groove 56 opened to the main surface 52. The grooves 55 and 56 respectively extend in the Y axis direction. The vibrating arm 5 has an approximately H-shaped cross-sectional shape in a portion where the grooves 55 and 56 are formed.

Similar to the vibrating arm 5, the vibrating arm 6 includes a pair of main surfaces 61 and 62 that is formed on the XY plane and forms a front-and-back relationship, and a pair of side surfaces 63 and 64 that is formed on the YZ plane and connects the pair of main surfaces 61 and 62. Further, the vibrating arm 6 includes a bottomed groove 65 opened to the main surface 61, and a bottomed groove 66 opened to the main surface 62. The grooves 65 and 66 respectively extend in the Y axis direction. The vibrating arm 6 has an approximately H-shaped cross-sectional shape in a portion where the grooves 65 and 66 are formed.

Figure 3:
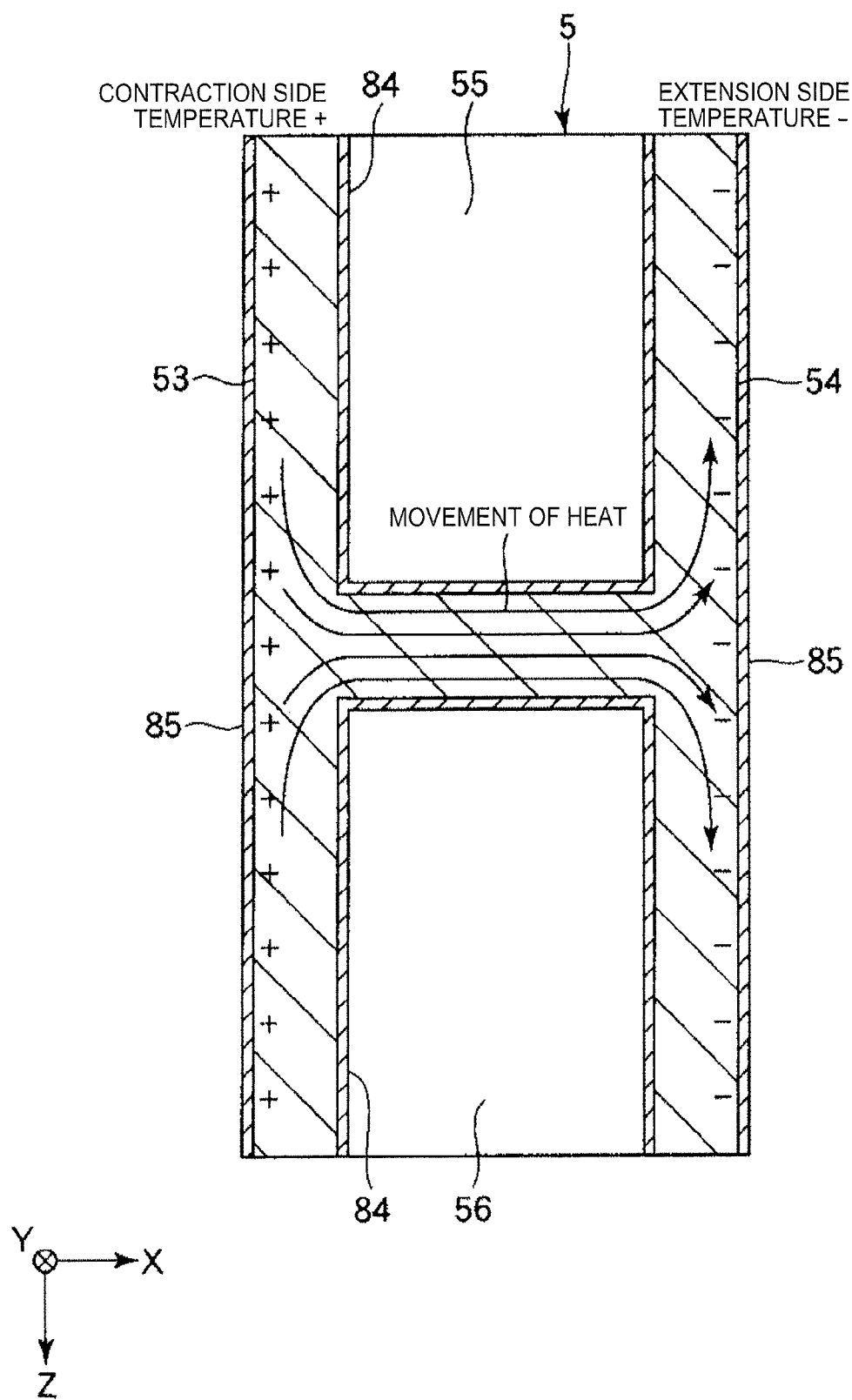
FIG. 3 is a diagram illustrating heat conduction during flexural vibration of a vibrating arm.

A pair of first drive electrodes 84 and a pair of second drive electrodes 85 are formed in the vibrating arm 5. Specifically, one first drive electrode 84 is formed on an inner surface of the groove 55, and the other first drive electrode 84 is formed on an inner surface of the groove 56. Further, one second drive electrode 85 is formed on the side surface 53, and the other second drive electrode 85 is formed on the side surface 54. FIG. 2 is a schematic view, but when the grooves 55, 56, 65, and 66 are formed by wet etching, an approximately H-shaped cross-sectional shape different from the shape shown in FIG. 3 is formed due to anisotropy of an etching rate according to the material of the substrate such as the quartz crystal substrate 3.

Similarly, a pair of first drive electrodes 84 and a pair of second drive electrodes 85 are formed in the vibrating arm 6. Specifically, one first drive electrode 84 is formed on the side surface 63, and the other first drive electrode 84 is formed on the side surface 64. Further, one second drive electrode 85 is formed on the inner surface of the groove 65, and the other second drive electrode 85 is formed on the inner surface of the groove 66.

If a voltage is alternately applied between the first drive electrode 84 and the second drive electrode 85, the vibrating arms 5 and 6 vibrate at a predetermined frequency in an in-plane direction (XY plane direction) while repeating approach and separation.

A material of the first drive electrode 84 and the second drive electrode 85 is not particularly limited, but a conductive material such as a metallic material such as gold (Au), gold alloy, platinum (Pt), aluminum (Al), aluminum alloy, silver (Ag), silver alloy, chrome (Cr), chrome alloy, copper (Cu), molybdenum (Mo), niobium (Nb), tungsten (W), iron (Fe), titanium (Ti), cobalt (Co), zinc (Zn) or zirconium (Zr), or indium tin oxide (ITO) may be used.

Hereinbefore, a configuration of the resonator element 2 is briefly described.

Thermoelastic Loss and Miniaturization

Next, thermoelastic loss and miniaturization of the resonator element 2 will be described.

Figure 4:
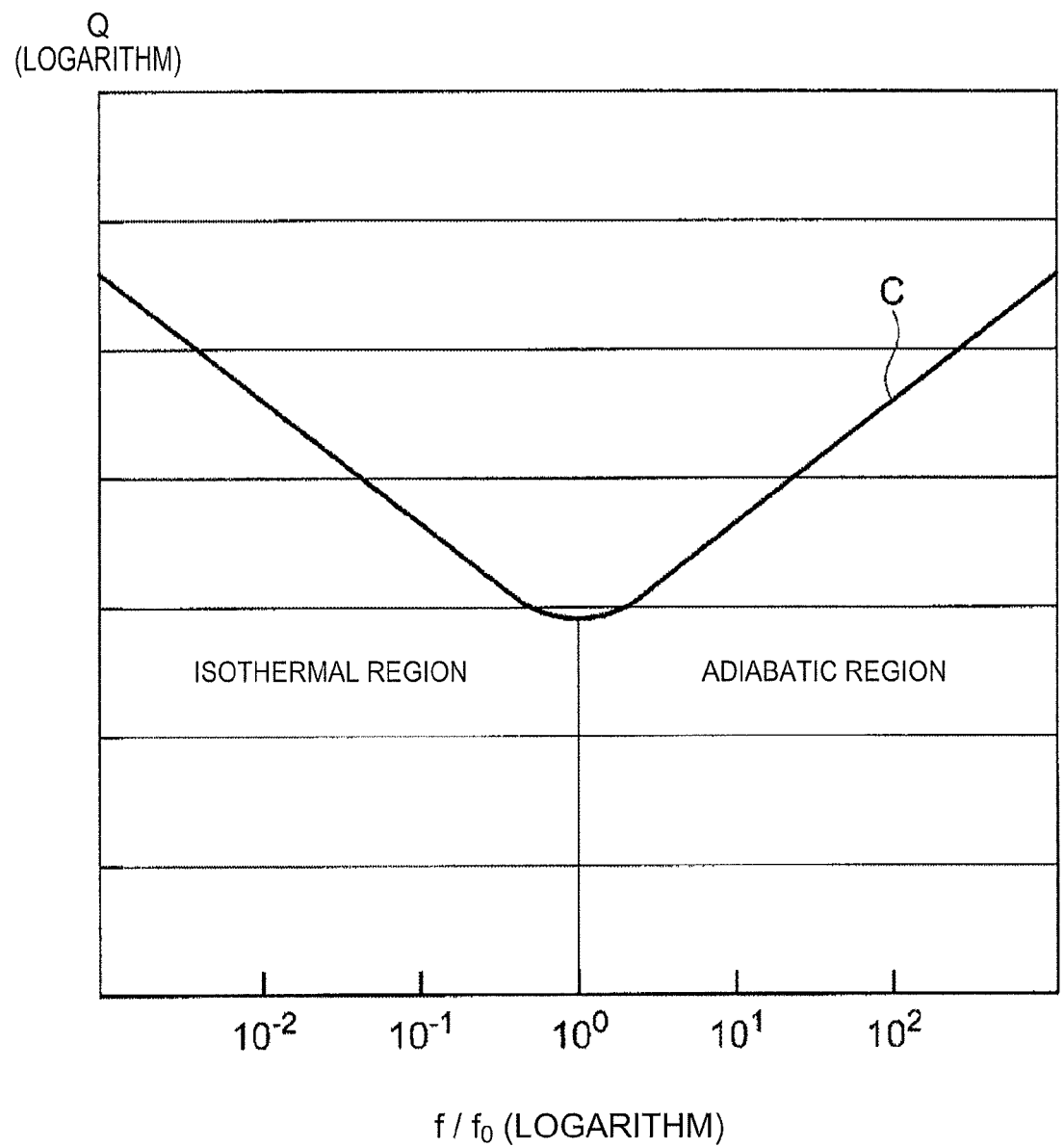
FIG. 4 is a graph illustrating the relationship between a Q value and f/fm.

FIG. 3 is a diagram illustrating heat conduction during flexural vibration of a vibrating arm, and FIG. 4 is a graph illustrating the relationship between a Q value and f/fm.

The resonator element 2 is set so that a mechanical vibration frequency f is higher than a thermal relaxation frequency f0 (f>f0). Thus, the resonator element 2 performs flexural vibration in an adiabatic region.

Here, the adiabatic region will be briefly described.

As described above, the resonator element 2 is configured so that the vibrating arms 5 and 6 perform flexural vibration in the in-plane direction by alternately applying the voltage between the first drive electrode 84 and the second drive electrode 85. Here, the thermoelastic loss may occur in the resonator element 2. For example, as shown in FIG. 3, during flexural vibration of the vibrating arm 5, if the side surface 53 of the vibrating arm 5 contracts, the side surface 54 extends, but in contrast, if the side surface 53 extends, the side surface 54 contracts. When the vibrating arm 5 does not generate the Gough-Joule effect (when energy elasticity is dominant with respect to entropy elasticity), since the temperature of the contracting surface side among the side surfaces 53 and 54 increases and the temperature of the extending surface side decreases, a temperature difference occurs between the side surface 53 and the side surface 54, that is, inside the vibrating arm 5. If heat conduction occurs between the side surface 53 and the side surface 54 due to the temperature difference, vibration energy loss occurs, and thus, the Q value of the resonator element 2 is decreased. Such energy loss is referred to as thermoelastic loss.

Generally, thermoelastic loss of a mobile object that performs flexural vibration (loss of vibration energy caused by heat conduction that occurs between a temperature increase in a contracting portion of a resonator element that performs flexural vibration and a temperature decrease in an extending portion thereof) becomes maximum when the vibration frequency f is equal to the relaxation frequency $fm=1/(2\cdot\pi\cdot\tau)$ (here, $\pi$ is the ratio of the circumference of a circle to its diameter, e is a Napier's constant, and $\tau$ c is a relaxation time necessary until a temperature difference becomes $e^{-1}$ times by the heat conduction), in the resonator element of a flexural vibration mode.

Generally, it is known that the relaxation frequency f0 when the vibrating arm has a flat-plate structure is calculated by the following expression (1).

$$f0 = (\pi \cdot k)/(2 \cdot \rho \cdot Cp \cdot a^2) \qquad (1)$$

Here, π represents the ratio of the circumference of a circle to its diameter, k represents thermal conductivity [W/(m·K)] of the vibrating arm in a vibration direction (flexural vibration direction), ρ represents mass density [kg/m³] of the vibrating arm, Cp represents heat capacity [J/(kg·K)] of the vibrating arm, and a represents width [m] of the vibrating arm in the vibration direction (flexural deviation direction).

If the relationship between the Q value and the frequency is generally expressed, line C shown in FIG. 4 is obtained. In FIG. 4, a frequency in which the Q value becomes minimum is the thermal relaxation frequency f0.

Further, when the vibrating arm has the flat-plate structure, the vibration frequency f becomes higher than the thermal relaxation frequency f0 with reference to a boundary of f/f0=1, in which a region where the frequency ratio is higher than 1 (1<f/f0) becomes an adiabatic region, and a region where the frequency ratio is lower than 1 (1>f/f0) is an isothermal region.

Further, when a thermal relaxation frequency in a structure in which the groove is formed in at least one of the main surfaces (two main surfaces directed in the direction perpendicular to the flexural vibration direction) that forms the front-and-back relationship in the vibrating arm is f1, the vibration frequency f becomes higher than the thermal relaxation frequency f1 with reference to the boundary of f/f1=1, in which a region where the frequency ratio is higher than 1 (1<f/f1) is an adiabatic region, and a region where the frequency ratio is lower than 1 (1>f/f1) is an isothermal region.

In addition, in the structure where the groove is formed in at least one of the main surfaces that forms the front-and-back relationship in the vibrating arm, a path through which the heat generated between the temperature increase in the contracting portion of the resonator element that performs the flexural vibration and the temperature decrease in the extending portion thereof flows is long compared with the flat-plate structure, and thus, the above-described relaxation time also becomes long. That is, the thermal relaxation frequency f1 becomes lower than the thermal relaxation frequency f0 of the flat-plate structure (f1<f0). Accordingly, the relationship of f1<(f0×f1)^{1/2}<f0 is satisfied. Thus, when the vibrating arm has the flat-plate structure, it is preferable to satisfy the relationship of f/f0 (adiabatic region). In the structure where the groove is formed in at least one of the main surfaces that forms the front-and-back relation in the vibrating arm, it is preferable to satisfy the relationship of f/f1 (adiabatic region), it is more preferable to satisfy the relationship of f>(f0×f1)^{1/2}, and it is most preferable to satisfy the relationship of f/f0.

By satisfying these relationships, the thermoelastic loss that occurs in the vibrating arms 5 and 6 of the resonator element 2 decreases.

In the structure where the groove is formed in at least one of the main surfaces that forms the front-and-back relation in the vibrating arm, if the relationship between f0 calculated by the expression (1) from the width of the vibrating arm (length in the flexural vibration direction) and the vibration frequency f satisfies f>f0, the relationship of f/f1 is satisfied.

Further, when the size of the base 4 is reduced, as the vibrating arms 5 and 6 perform flexural vibration while alternately repeating separation and approach, flexural vibration where the base 4 is displaced in the Y axis direction is generated. Thus, the thermoelastic loss also occurs in the base 4, which consequently causes deterioration of the Q value of the resonator element 2.

Accordingly, the present inventors compared the thermoelastic loss due to flexural vibration of the base 4 generated due to flexural vibration of the vibrating arms 5 and 6, and thermoelastic loss obtained by converting the Q value of the resonator element 2 into flexural vibration of the base 4, in consideration of the relationship between the dimension and the thermoelastic loss in the base 4 of the resonator element 2.

In the base 4, a portion where the length of the base 4 in the Y axis direction (hereinafter, referred to as "the width of the base 4") is the narrowest has the lowest rigidity and is thus most bent to be deformed. Accordingly, heat is generated as contracting deformation and extending deformation alternately applied to end portions of the narrowest portion in the width direction and is diffused to cause thermoelastic loss, which causes the severest deterioration of the Q value.

Figure 5:
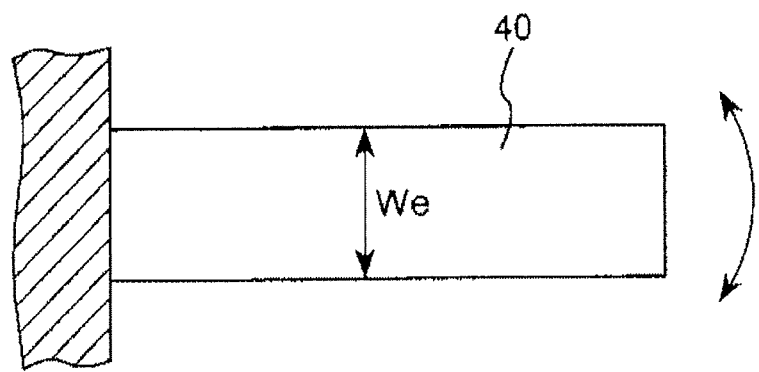
FIG. 5 is a diagram illustrating an effective width We of a base in a first direction.

FIG. 5 is a diagram illustrating an effective width We of a base in a first direction.

As shown in FIG. 5, when assuming a virtual beam 40 having a width in the same direction as the direction of the width (shortest distance Wb between the first end surface 41a and the second end surface 42a of the base 4) of the base 4 in the portion having the narrowest width, the width of the virtual beam 40 set so that the Q value due to flexural vibration of the virtual beam 40 is equivalent to the Q value of the entire resonator element 2 is defined as the effective width We. Then, a relational expression between the effective width We and a thermal relaxation frequency f0e in the flexural vibration of the virtual beam 40 is established, and optimization of the ratio (Wb/We) between the shortest distance Wb and the effective width We is attempted. Thus, the deterioration of the Q value according to the miniaturization of the resonator element 2 is reduced.

The following expression (2) is an expression indicating the Q value of the entire resonator element 2, and the following expression (3) is an expression indicating the thermal relaxation frequency f0e which is a frequency where the Q value becomes the minimum in the expression (1).

$$Q = \{(\rho \cdot Cp)/(c \cdot \alpha^2 \cdot \Theta)\} \times [\{1+(f/f0e)\}/(f/f0e)] \qquad (2)$$

$$f0e = (\pi \cdot k)/(2 \cdot \rho \cdot Cp \cdot We^2) \qquad (3)$$

Here, We represents the effective width (width of the virtual beam) [m], f represents the vibration frequency [Hz] of the resonator element (actual vibration frequency obtained in a state where the resonator element is mounted on a package), f0e represents an effective thermal relaxation frequency [Hz] of the resonator element (thermal relaxation frequency of the virtual beam), and Q represents the Q value of the resonator element (actual Q value obtained in a state where the resonator element is mounted on the package).

The following expression (A) is calculated from the expressions (2) and (3). As understood from the expression (A), the Q value forms the relational expression of We.

$$Q = \{(\rho \cdot Cp)/(c \cdot \alpha^2 \cdot \Theta)\} \times [\{1+(2 \cdot \rho Cp \cdot We^2 \cdot f/(\pi \cdot k))^2\}/(2 \cdot \rho \cdot Cp \cdot We^2 \cdot f/(\pi \cdot k))] \qquad (A)$$

Further, the following constants are constants which are unmistakably determined if materials are determined (from the relationship with the quartz crystal axes if a cut angle of quartz crystal is determined), in which ρ is mass density [kg/m³], Cp is thermal capacity [J/(kg·K)], c is an elastic constant [N/m²] in a direction orthogonal to the direction of Wb in the plane, α is a thermal expansion coefficient [1/K] in the direction orthogonal to the direction of Wb in the plane, Θ is environmental temperature [K], and k is thermal conductivity [W/(m·K)] in the direction of Wb.

Accordingly, since only the We is a variable that is not already known in the expressions (2) and (3), the effective width We is calculated from the expression (A).

Next, correlation between the Q value and We of the resonator element 2 is inspected using numerical analysis based on simulation (finite element method) by changing the dimension of Wb of the base 4 of the resonator element 2, and optimization of Wb/We is inspected.

Figure 6:
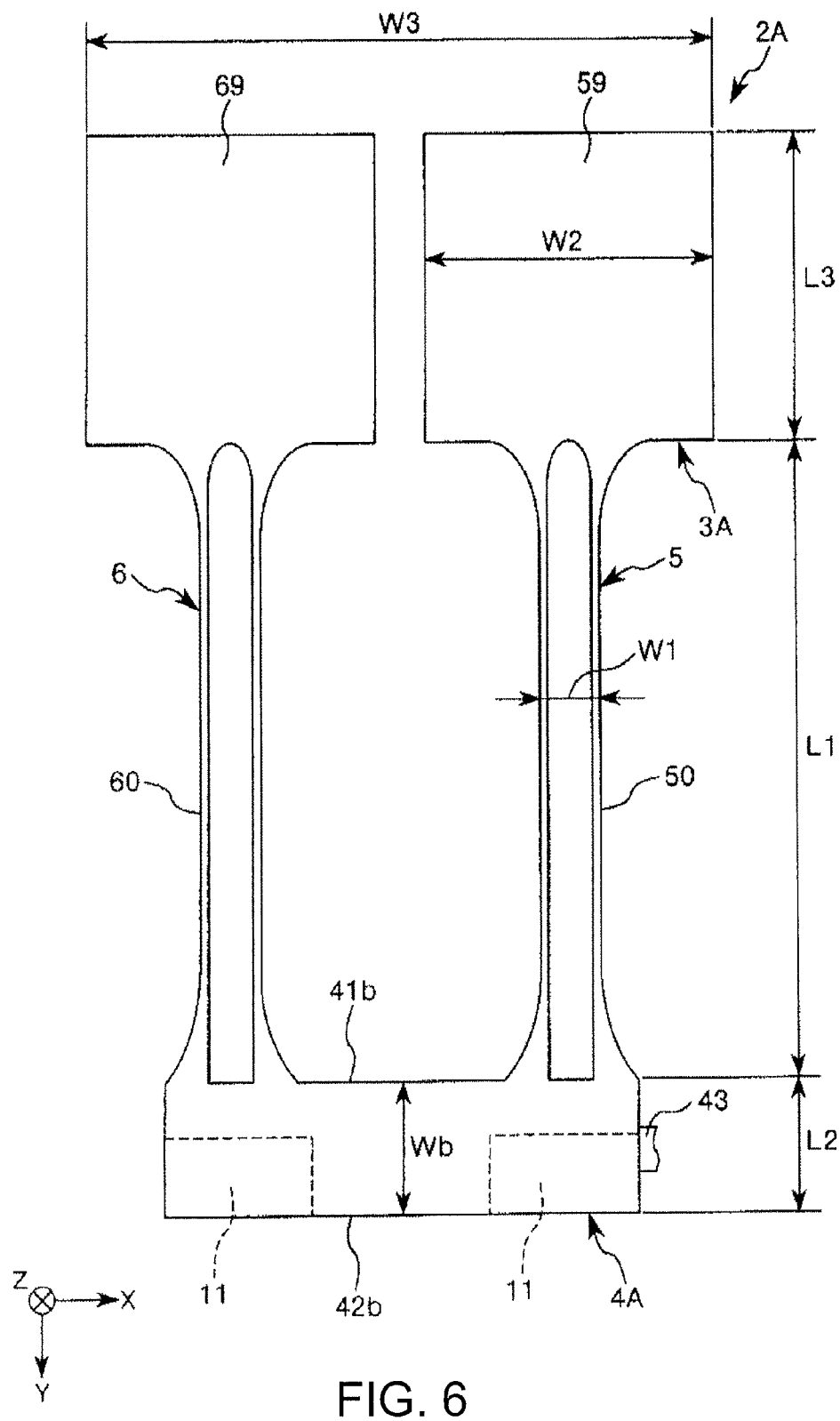
FIG. 6 is a plan view illustrating a resonator element used for simulation analysis.
Figure 8:
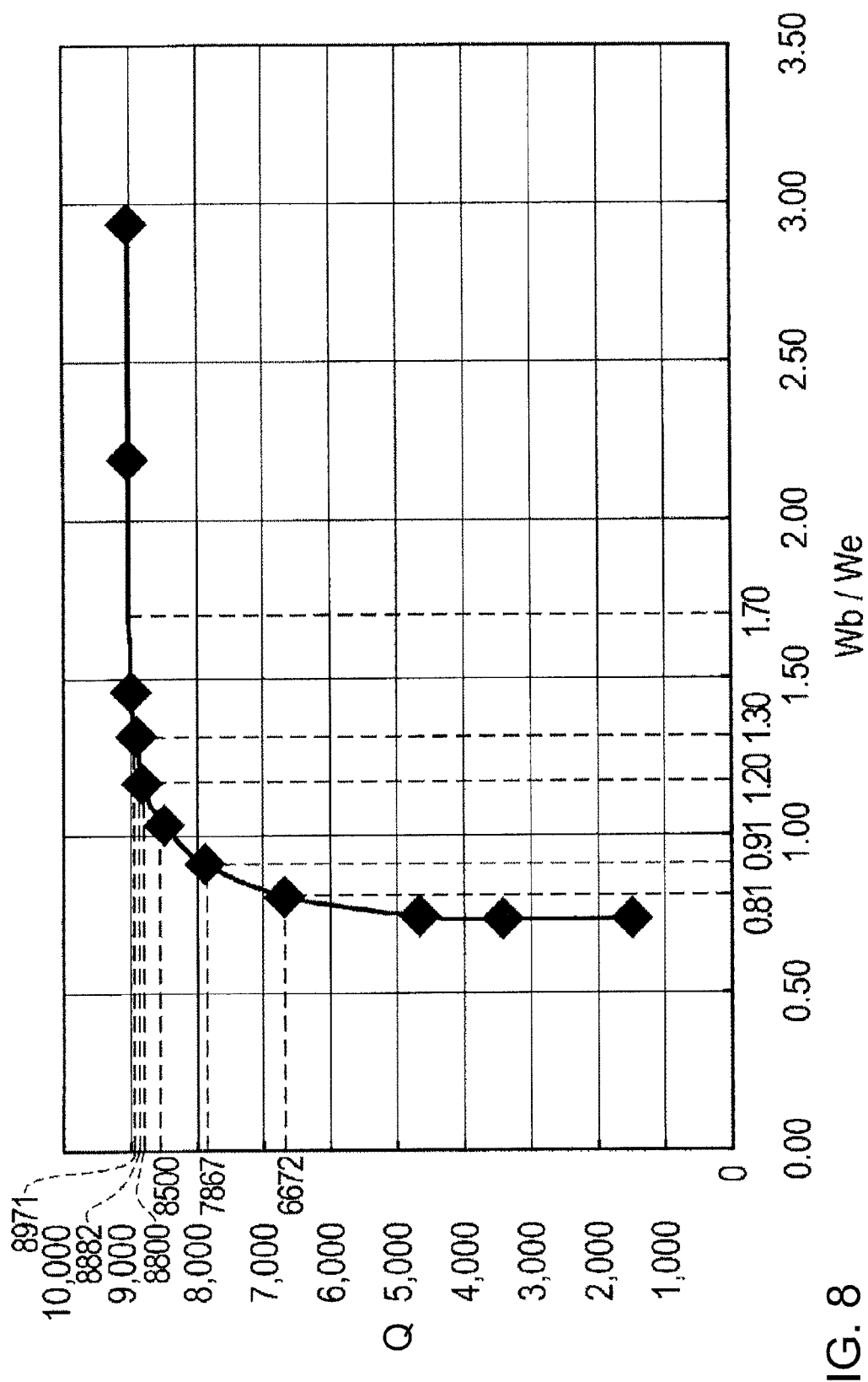
FIG. 8 is a graph illustrating the relationship between Wb/We and a Q value based on the results shown in FIG. 7.

FIG. 6 is a plan view illustrating a resonator element used for the simulation analysis. Further, FIG. 7 is a table illustrating conditions and results of the simulation analysis. FIG. 8 is a graph illustrating the relationship between Wb/We and the Q value based on the results shown in FIG. 7.

The simulation uses a resonator element 2A shown in FIG. 6. A quartz crystal substrate 3A provided for the resonator element 2A includes a base 4A instead of the above-described base 4. The base 4A is the same as the base 4, except that the width reduction portions 41 and 42 are not provided.

In this simulation, dimensions of respective portions of the resonator element 2A are as follows.

That is, a length L1 (length in the Y axis direction) of the arm portions 50 and 60 of the vibrating arms 5 and 6 is 573 [μm], a length L2 (length in the Y axis direction) of the base 4A is Wb, a length L3 (length in the Y axis direction) of the hammer heads 59 and 69 is 137 [μm], a width W1 (length in the X axis direction) of the arm portions 50 and 60 is 40 [μm], a width W2 (length in the X axis direction) of the hammer heads 59 and 69 is 255 [μm], a width W3 (length in the X axis direction) of the entire resonator element 2A is 550 [μm], and a thickness T (length in the Z axis direction) of the base 4 and the vibrating arms 5 and 6 is 130 [μm], and a depth t of the grooves 55, 56, 65, and 66 is 60 [μm].

Further, the respective parameters in the expressions (2) and (3) used in the simulation are as follows: $\rho=2649$ [kg/m$^3$], $Cp=735.3718$ [J/(kg·K)], $\alpha=\alpha 11=\alpha 22=1.37\times 10^{-5}$ [1/K], $c=c11=c22=8.67\times 10^{10}$ [N/m$^2$], $\Theta=298.15$ [K], and $k=8.47$ [W/(m·K)].

Since the quartz crystal substrate 3A is a Z-cut quartz crystal plate (cut angle of 0 degree), $\alpha=\alpha 11=\alpha 22$, and $c=c11=c22$. Further, the shapes of the grooves 55, 56, 65, and 66 of the vibrating arms 5 and 6 are analyzed as shapes that reflect anisotropy during wet etching.

The results shown in FIGS. 7 and 8 are obtained by the simulation. As shown in FIGS. 7 and 8, when the dimension of the shortest distance Wb of the base 4 is changed to 25 μm to 200 μm, the Q value is greatly changed to 1,484 to 9,018. Here, when Wb/We is approximate 1 or more, the Q value becomes approximate 8,500 or more, and when Wb/We is approximate 1.3 or more, the Q value becomes an approximately constant value of approximate 9,000.

By setting Wb/We in a range of 0.81 to 1.70 (that is, by satisfying the following expression (B)) using the above results, Wb can be set in a range of 50 μm to 116 μm, the Q value can be set in a range of 6,672 to 8,971, and an entire length of the resonator element can be set in a range of 760 μm to 826 μm. Thus, the Q value (6,600 or more) capable of performing stable oscillation using an oscillation circuit is obtained, and compared with a resonator element having Wb (=L2) of 200 μm and an entire length (L1+L2+L3) of 910 μm according to a related art design, miniaturization of 9.2% to 16.5% of the entire length is obtained. This result is similarly applied to the resonator element 2 having the width reduction portions 41 and 42.

$$0.81 \leq Wb/We \leq 1.70 \quad (B)$$

In this way, by satisfying the expressions (A) and (B), it is possible to reduce thermoelastic loss due to the miniaturization of the base 4. Thus, it is possible to reduce thermoelastic loss while achieving miniaturization of the vibrating arms 5 and 6 in the extension direction. Further, it is preferable to satisfy $0.91 \leq Wb/We \leq 1.30$, and more preferable to satisfy $1.00 \leq Wb/We \leq 1.20$.

By setting Wb/We in a range of 0.91 to 1.30, Wb can be set in a range of 60 μm to 89 μm, the Q value can be set in a range of 7,867 to 8,882, and the entire length of the resonator element can be set in a range of 770 μm to 799 μm. Thus, a favorable Q value (7,800 or more) is obtained, and compared with the resonator according to the related art design, miniaturization of 12.2% to 15.4% of the entire length is obtained.

By setting Wb/We in a range of 1.00 to 1.20, Wb can be set in a range of 70 μm to 80 μm, the Q value can be set in a range of 8,500 to 8,800, and the entire length of the resonator element can be set in a range of 780 μm to 790 μm. Thus, a favorable Q value (8,500 or more) is obtained, and compared with the resonator according to the related art design, miniaturization of 13.2% to 14.3% of the entire length is obtained.

In the adiabatic region where the vibration frequency f of the resonator element 2 is higher than the thermal relaxation frequency f0b when the base 4 is considered as a flexural vibrating body, it is preferable that Wb/We is in the above-mentioned ranges.

Here, f0b is a thermal relaxation frequency obtained by replacing "a" in the expression (1) with Wb, and can be indicated by the following expression (5).

$$f0b=(\pi \cdot k)/(2 \cdot \rho \cdot Cp \cdot Wb^2) \quad (5)$$

Further, in the isothermal region where the vibration frequency f of the resonator element 2 is lower than the thermal relaxation frequency f0b, if f0 in FIG. 4 is replaced with f0b, and if the vibration frequency f is fixed, as the thermal relaxation frequency f0b increases, the thermoelastic loss decreases and the Q value becomes great. That is, as the thermal relaxation time having a reciprocal relation with the thermal relaxation frequency f0b decreases, that is, as the minimum distance Wb that is a path through which the heat propagates decreases, the thermoelastic loss decreases, and the Q value becomes great, and thus, it is preferable that Wb/We is in a range equal to or less than 1.00.

As described above, by optimizing Wb/We, it is possible to reduce thermoelastic loss while achieving miniaturization of the resonator element 2, and to realize the excellent Q value. These effects are remarkable since the base 4 is easily bent if the length of the base 4 in the X axis direction is longer than the length of the base 4 in the Y axis direction.

Further, in addition to the optimization of the above-described Wb/We, as shown in FIG. 1, in one end portion (end portion in the +X axis direction) among the end portions of the base 4 in the X axis direction, a protruding portion 43 is provided as a breaking mark. Thus, the effect obtained by optimizing the above-described Wb/We is preferably achieved. Further, the size of the resonator element 2 in the Y axis direction does not increase due to the protruding portion 43.

Hereinafter, the protruding portion 43 will be described in detail.

Figure 9:
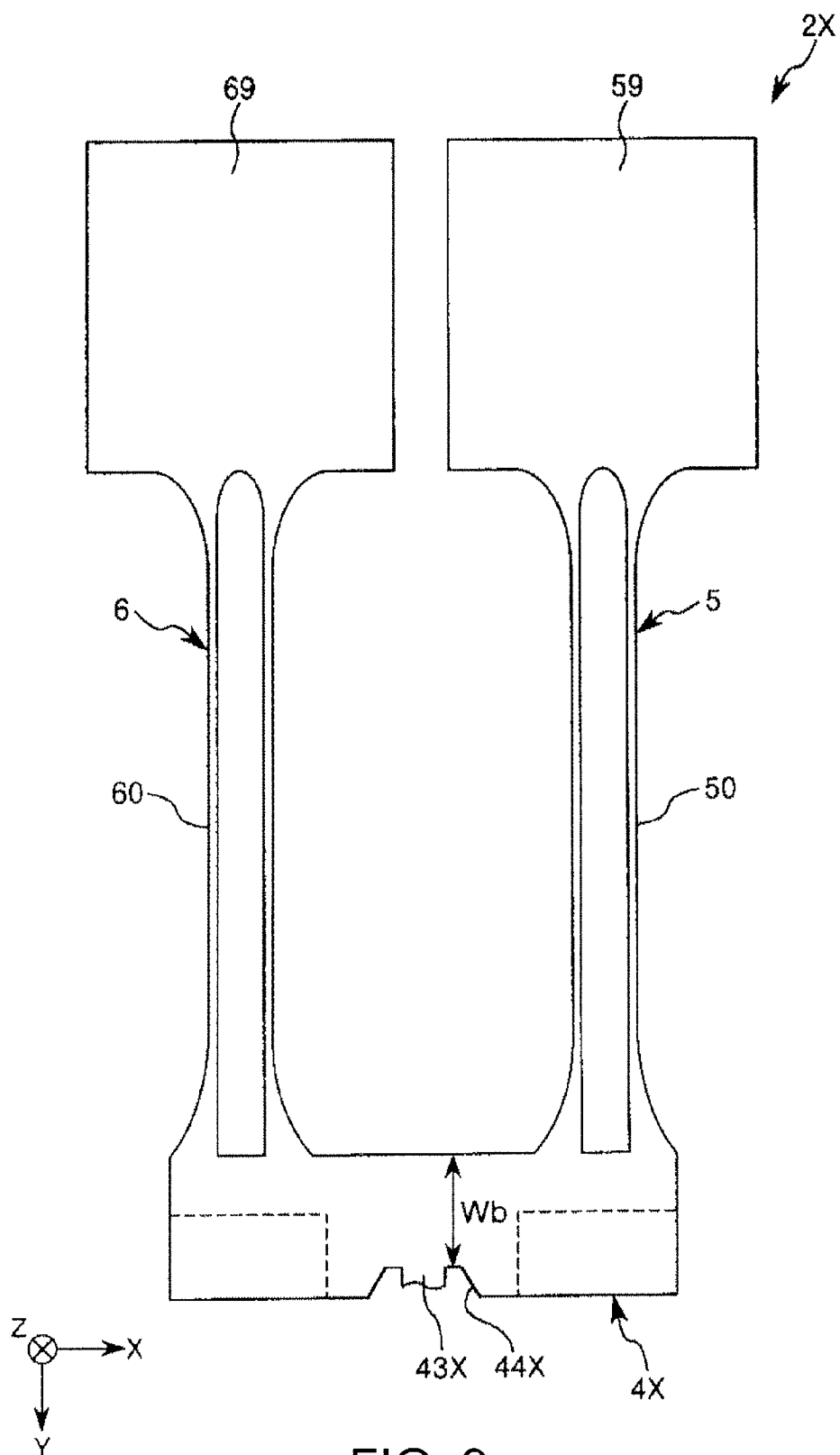
FIG. 9 is a plan view illustrating a resonator element in the related art.
Figure 11A:
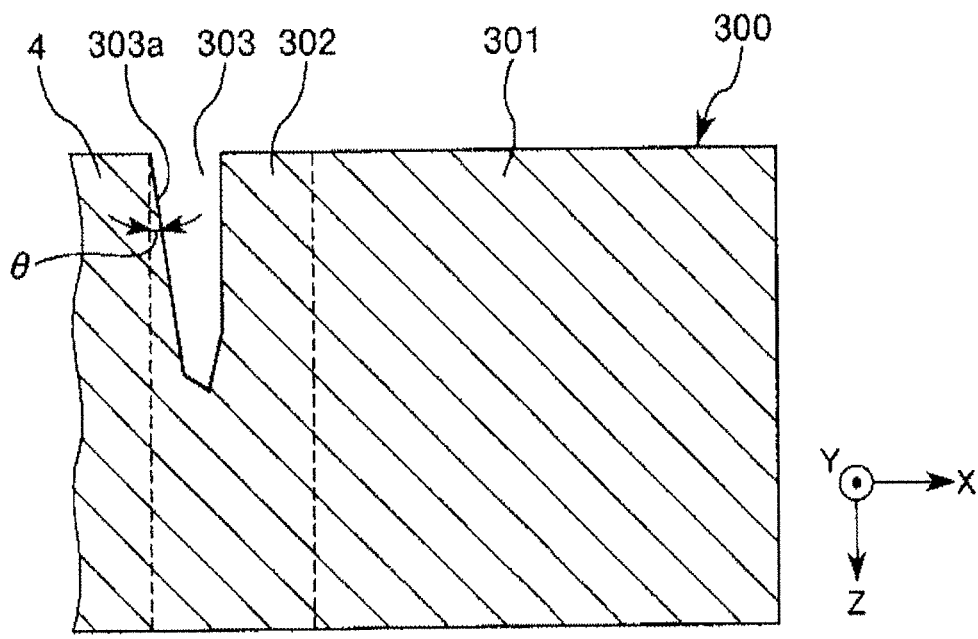
FIG. 11A is a sectional view taken along line B-B in FIG. 10B.
Figure 11B:
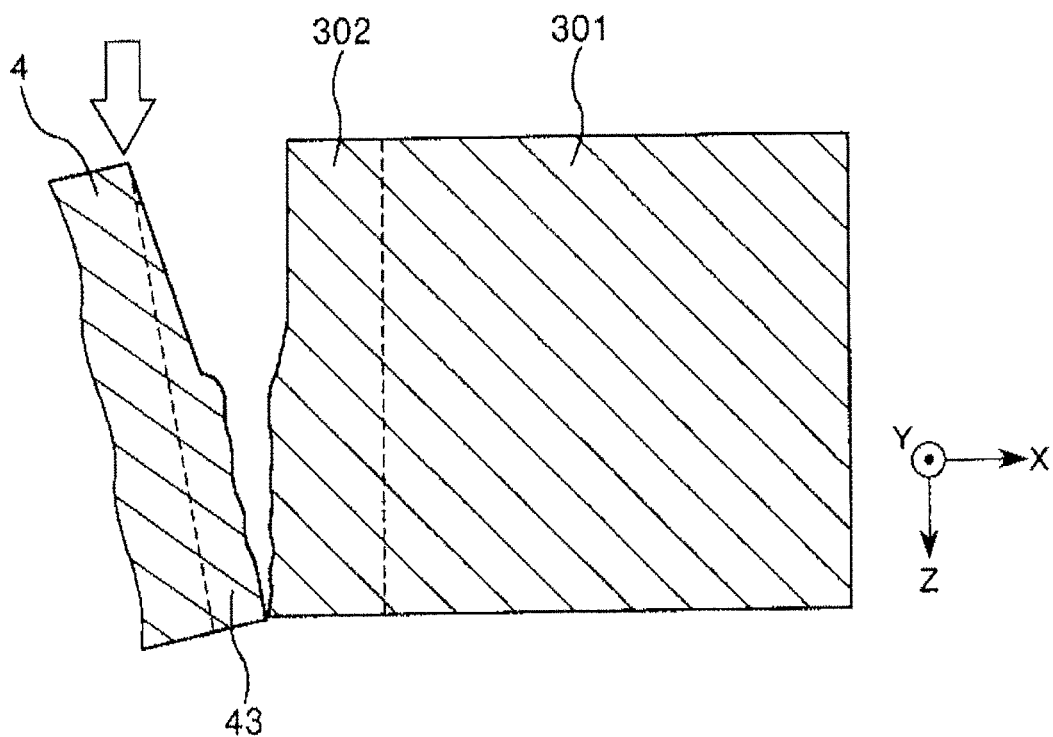
FIG. 11B is a diagram illustrating breakage in the breaking portion shown in FIG. 11A.

FIG. 9 is a plan view illustrating a resonator element in the related art. Further, FIGS. 10A and 10B are a top view and a bottom (perspective) view illustrating an electrode configuration and a breaking portion of the resonator element shown in FIG. 1. FIG. 11A is a sectional view taken along line B-B in FIG. 10B, and FIG. 11B is a diagram illustrating breakage in the breaking portion shown in FIG. 11A.

As shown in FIG. 9, a protruding portion 43X is provided as a breaking mark in an end portion of a base 4X provided for a resonator element 2X opposite to the vibrating arms 5 and 6. Further, concave portions 44X are formed in the vicinity of the root of the protruding portion 43X of the base 4X.

In the resonator element 2X having this configuration, due to the concave portions 44X, the shortest distance Wb of the base 4X is unnecessarily shortened, and consequently, the thermoelastic loss increases. Further, in the resonator element 2X, when the vibrating arms 5 and 6 perform flexural vibration, distortion is concentrated on the concave portions 44X, and accordingly, heat flow increases due to an increased temperature change of the base 4X. As a result, the thermoelastic loss also increases. Further, in the resonator element 2X, when shock is applied from the outside, stress is concentrated on the concave portions 44X, which may be a starting point of breakage.

Thus, in order to solve the above problems, in the resonator element 2, as described above, the protruding portion 43 is provided in the end portion of the base 4 in the +X axis direction so that the effects obtained by optimizing the above-described Wb/We are preferably shown.

Further, a distance La between the virtual line Y1 and a tip end of the protruding portion 43 in the X axis direction is shorter than a distance Lb between the virtual line Y1 and an end portion, opposite to the virtual line Y1, of the hammer heads 59 and 69 in the X axis direction in the planar view.

Thus, a protrusion amount of the protruding portion 43 from the base 4 in the X axis direction can be made smaller than a protrusion amount of the hammer heads 59 and 69 from the base 4 in the X axis direction. Thus, the protruding portion 43 can be provided without increasing the maximum size of the resonator element 2 in the X axis direction. Further, when obtaining the resonator element 2 having a predetermined vibration frequency and a predetermined length, the width (length in the X axis direction) of the arm portions 50 and 60 can be lengthened so as to return the vibration frequency reduced as the width of the hammer heads 59 and 69 is increased to the original value, and thus, the path through which heat generated during flexural vibration flows can be lengthened. Consequently, by increasing the width of the hammer heads 59 and 69, it is possible to reduce the thermoelastic loss in the adiabatic region.

As shown in FIGS. 10A and 10B, the resonator element 2 having the protruding portion 43 is obtained by etching a quartz crystal wafer to form an appearance with a part of the base 4 being connected to a base material 30 of the wafer through a breaking portion 300, and then, by breaking the breaking portion 300. The protruding portion 43 is a breaking mark formed by breaking the breaking portion 300.

Here, although not shown, before the breaking is performed in the breaking portion 300, plural vibration pieces 2 are arranged in the X axis direction. Further, on both of the surfaces of the base 4, a wiring 86 that electrically connects the first drive electrodes 84, and a wiring 87 that electrically connects the second drive electrodes 85 are provided. Further, a pair of inspection electrodes 88 and 89 is provided on one surface of the base material 30 for each resonator element 2. Before the breaking is performed in the breaking portion 300, the electrode 88 is electrically connected to the first drive electrode 84, and the electrode 89 is electrically connected to the second drive electrode 85. Thus, before the breaking is performed in the breaking portion 300 using the electrodes 88 and 89, inspection and adjustment such as frequency adjustment can be performed in a state where the plural resonator elements 2 are collected. The wirings 86 and 87, and the electrodes 88 and 89 can be collectively formed with the first drive electrode 84 and the second drive electrode 85. Further, the frequency adjustment performed in a state where the plural resonator elements 2 are connected to the base material 30 is preferably performed to be in a range within 10% from a desired vibration frequency, and is more preferably performed to be in a range within 5%. With such a configuration, even though frequency variation due to shape variation caused by etching, which is particularly noticeably generated during miniaturization, increases, it is possible to suppress reduction of a yield rate, and to obtain a small resonator element 2 with high frequency accuracy.

The breaking portion 300 includes a broad portion 301 that protrudes from the base material 30, and a narrow portion 302 that protrudes from a tip end portion of the broad portion 301. Further, the base 4 is connected to a tip end portion of the narrow portion 302. In this way, by providing the narrow portion 302 having a width narrower than that of the broad portion 301, when breaking the breaking portion 300, stress is easily concentrated on the narrow portion 302, to thereby make it possible to reduce variation of locations to be broken between products, and to locally break the breaking portion 300 at a desired location. In addition, since the width of the broad portion 301 gradually decreases from the base material 30 to the narrow portion 302, it is possible to prevent the broad portion 301 from being broken in the vicinity of a boundary between the base material 30 and the broad portion 301. Further, it is possible to decrease an interval with a resonator element (not shown) adjacently arranged in the X axis direction, to thereby increase the number of resonator elements 2 capable of being obtained from the base material 30.

Particularly, in the present embodiment, as shown in FIG. 10A, and FIGS. 11A and 11B, on one surface (opposite to the electrodes 88 and 89) of the narrow portion 302, a groove 303 that extends in the width direction is formed. Thus, a thin portion which is a fragile portion is formed in the narrow portion 302. Thus, as shown in FIG. 11B, when an external force is applied from a top surface side of the breaking portion 300 to break the breaking portion 300, the breaking portion 300 is locally broken in the thin portion of the narrow portion 302. Further, it is possible to suppress a size increase of the protruding portion 43 that is the breaking mark. Furthermore, by providing the groove 303 on the surface of the narrow portion 302 opposite to the electrodes 88 and 89, the electric connection between the electrodes 88 and 89, and the first and second drive electrodes 84 and 85 can be easily achieved.

Further, in the groove 303, the width (length in the Y axis direction) and the position of the groove 303 with respect to the width (length in the Y axis direction) of the narrow portion 302 are not particularly limited, but it is preferable that the groove 303 is provided over the entire region of the narrow portion 302 in the width direction. With such a configuration, it is possible to prevent the shape of the end surface of the protruding portion 43 which is the breaking mark from being rough. In addition, it is possible to suppress a size increase of the resonator element 2 in the X axis direction due to the protruding portion 43.

Further, a side surface of the groove 303 on the side of the base 4 is formed with an inclined surface 303a tilted at an inclination angle θ with respect to the thickness direction of the wafer. Thus, the electrode formed on the side surface of the groove 303 on the side of the base 4 can be easily broken using vertical exposure. Accordingly, it is possible to prevent a short circuit of the first drive electrode 84 and the second drive electrode 85 formed on the side surface of the base 4. In a case where the groove 303 is not formed, the short circuit of the first drive electrode 84 and the second drive electrode 85 can be prevented by patterning of front and rear sides of the breaking portion 300.

In addition, the width (length in the X axis direction) of the groove 303 is preferably 1 μm to 100 μm, and is more preferably 5 μm to 50 μm. Thus, it is possible to easily form the groove 303 while increasing the number of the resonator elements 2 obtained in the wafer.

Furthermore, the thickness of the thin portion formed by the groove 303 of the narrow portion 302 is preferably 10% to 70%, and is more preferably 30% to 60%, with respect to the entire thickness of the narrow portion 302. In other words, the depth of the groove 303 is preferably 30% to 90%, and is more preferably 40% to 70%, with respect to the entire thickness of the narrow portion 302. Thus, it is possible to secure a necessary strength of the narrow portion 302 while preventing a size increase of the protruding portion 43 which is the breaking mark, and thus, it is possible to prevent separation of the resonator element 2 when etching the wafer.

The groove 303 can be relatively simply formed by performing half-etching using wet etching. Further, when forming the grooves 55, 56, 65, and 66 of the vibrating arms 5 and 6 by etching, the groove 303 can be collectively formed. Thus, there is no complication of the manufacturing process due to formation of the groove 303.

Further, the groove 303 is disposed on the +X axis direction side with respect to the base 4. Thus, the inclined surface 303a can be easily formed using anisotropy by performing half-etching using wet etching.

In addition, the broad portion 301 protrudes in the Y axis direction from the base material 30, and the narrow portion 302 protrudes in the X axis direction from the broad portion 301. Thus, the plural resonator elements 2 can be efficiently arranged in the wafer.

Furthermore, as described above, the width reduction portions 41 and 42 where the width is gradually reduced along the virtual line Y1 as they become distant from the central portion of the base 4 are provided in the base 4. Thus, deformation caused in the base 4 due to flexural vibration of the vibrating arms 5 and 6 is suppressed by being blocked by the width reduction portions 41 and 42. Thus, in a state where the resonator element 2 is attached to the package by fixing the base 4 to the package using an adhesive or a bump, it is possible to reduce vibration leakage to the package from the base 4 through the adhesive or bump, and to increase the Q value. The vibration leakage reduction effect of the base 4 using the width reduction portions 41 and 42 was confirmed by analysis using simulation by the inventors.

Further, as described above, the hammer heads 59 and 69 are provided in the tip end portions of the vibrating arms 5 and 6. That is, the vibrating arms 5 and 6 include the hammer heads 59 and 69 and the arm portions 50 and 60 disposed between the hammer heads 59 and 69 and the base 4. Thus, in order to obtain the resonator element 2 that vibrates at a predetermined vibration frequency, compared with a case where the hammer heads 59 and 69 are not provided, it is possible to shorten the lengths of the vibrating arms 5 and 6, and consequently, to shorten the entire length of the resonator element 2. In addition, when obtaining the resonator element 2 having a predetermined vibration frequency and a predetermined length, the width of the arm portions 50 and 60 can be increased so as to return the vibration frequency reduced as the hammer heads 59 and 69 are provided to the original, and thus, the path through which heat generated during flexural vibration flows can be lengthened. Consequently, it is possible to reduce the thermoelastic loss in the adiabatic region.

Since the width of the hammer heads 59 and 69 is wider than the width of the arm portions 50 and 60, it is possible to effectively increase the mass of the hammer heads 59 and 69 as the weight portion. Thus, it is possible to efficiently achieve miniaturization of the resonator element 2, and to efficiently reduce the thermoelastic loss.

Further, the ratio W2/W1 of the width W2 of the hammer heads 59 and 69 to the width W1 of the arm portions 50 and 60 is preferably 4 to 10, and is more preferably 5 to 7. Thus, it is possible to enhance the thermoelastic loss reduction effect by the hammer heads 59 and 69 while reducing increase of vibration leakage according to increase of unnecessary vibration of the hammer heads 59 and 69. This is because since the flexural vibration of the vibrating arms 5 and 6 in a tuning fork type resonator is not pure in-plane vibration but is basically accompanied by rocking movement, if the width of the hammer heads 59 and 69 is excessively great, the rocking movement increases so that the base 4 vibrates in the ±Z axis direction and vibration energy is consequently leaked through the bonding material 11 provided in the base 4.

Modification Example of Resonator Element of the First Embodiment

Hereinafter, modification examples of the resonator element according to the above-described first embodiment will be described.

Figure 12:
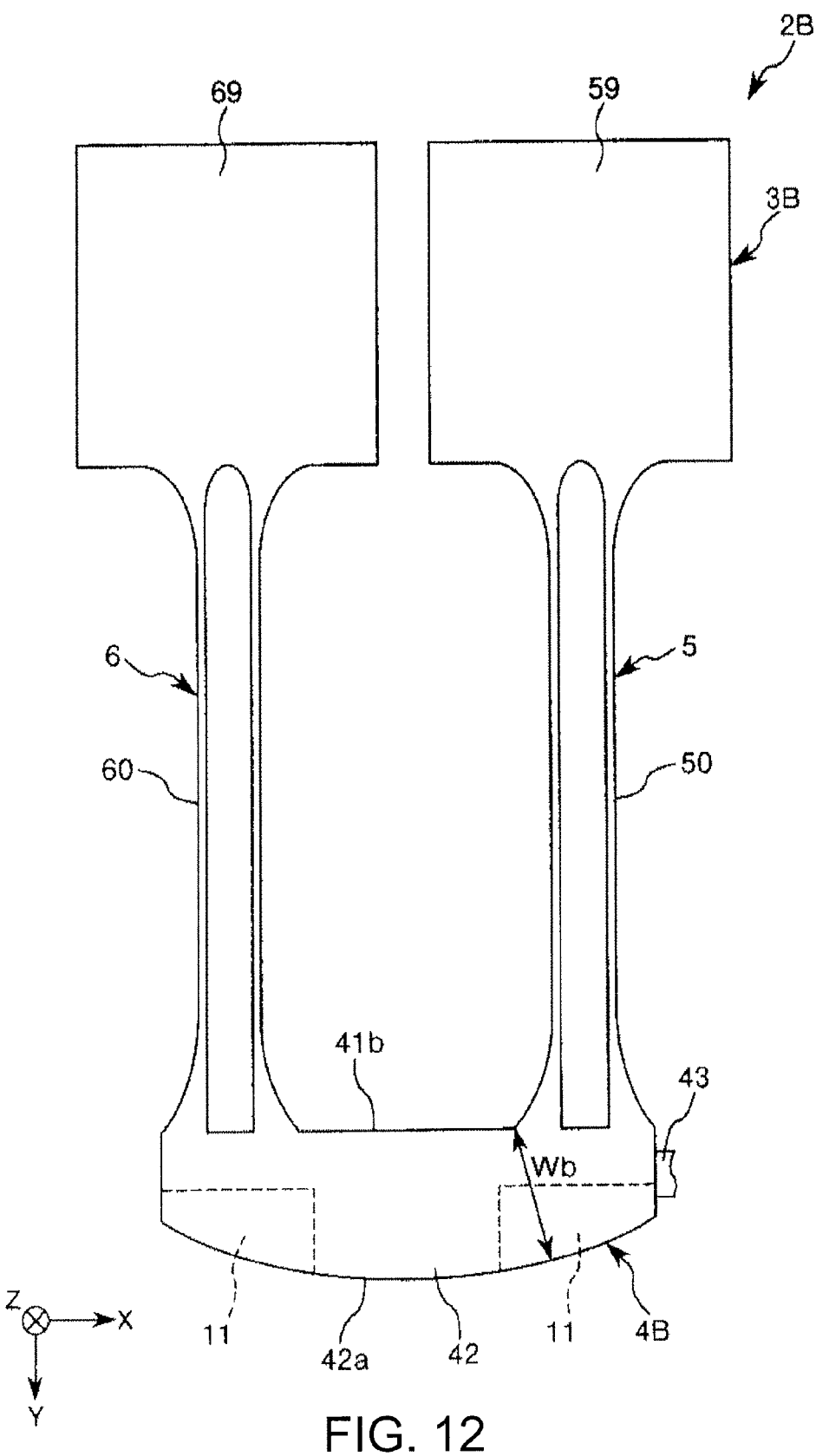
FIG. 12 is a plan view (top view) illustrating Modification Example 1 of the resonator element according to the first embodiment of the invention.
Figure 13:
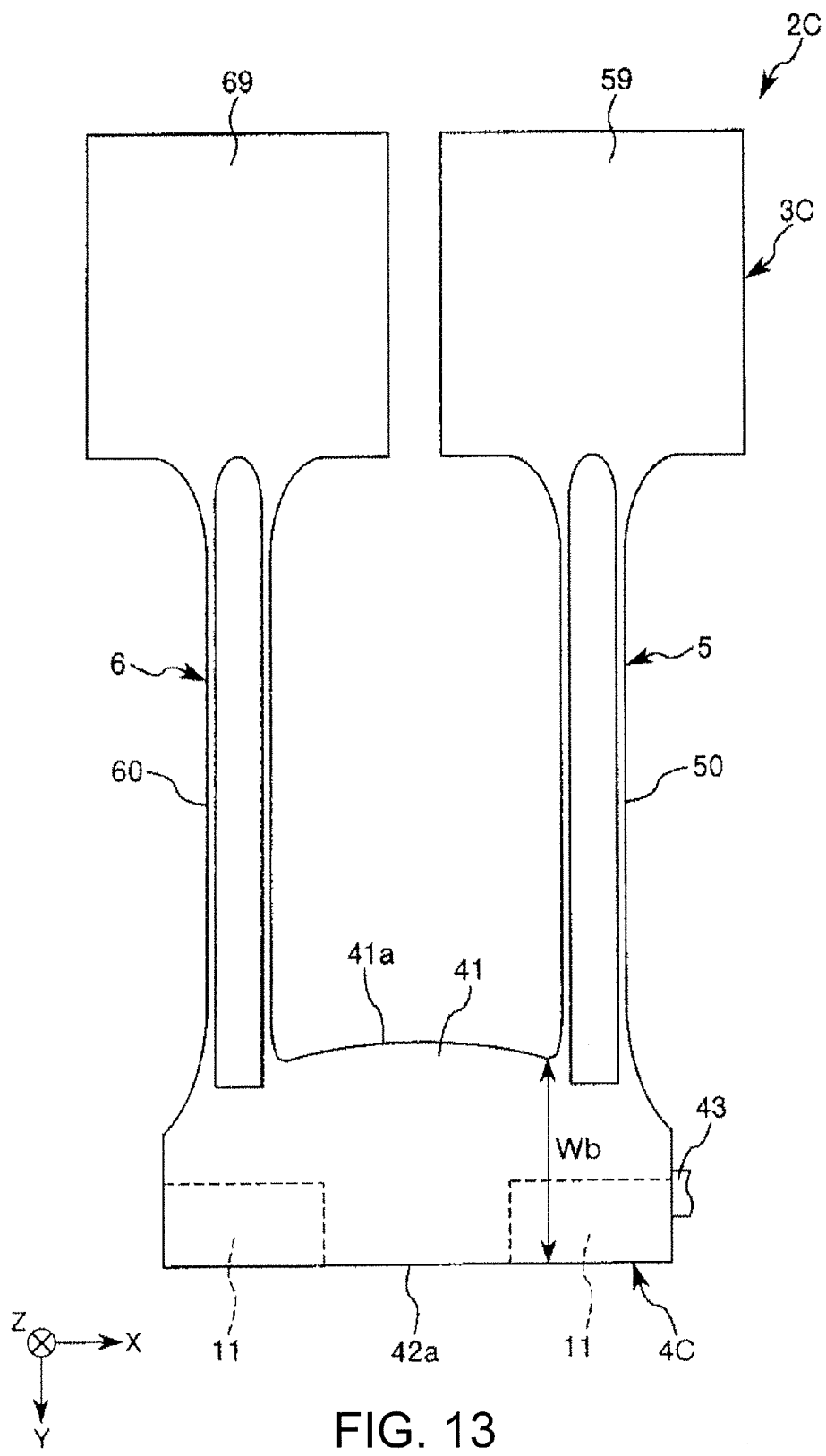
FIG. 13 is a plan view (top view) illustrating Modification Example 2 of the resonator element according to the first embodiment of the invention.
Figure 14:
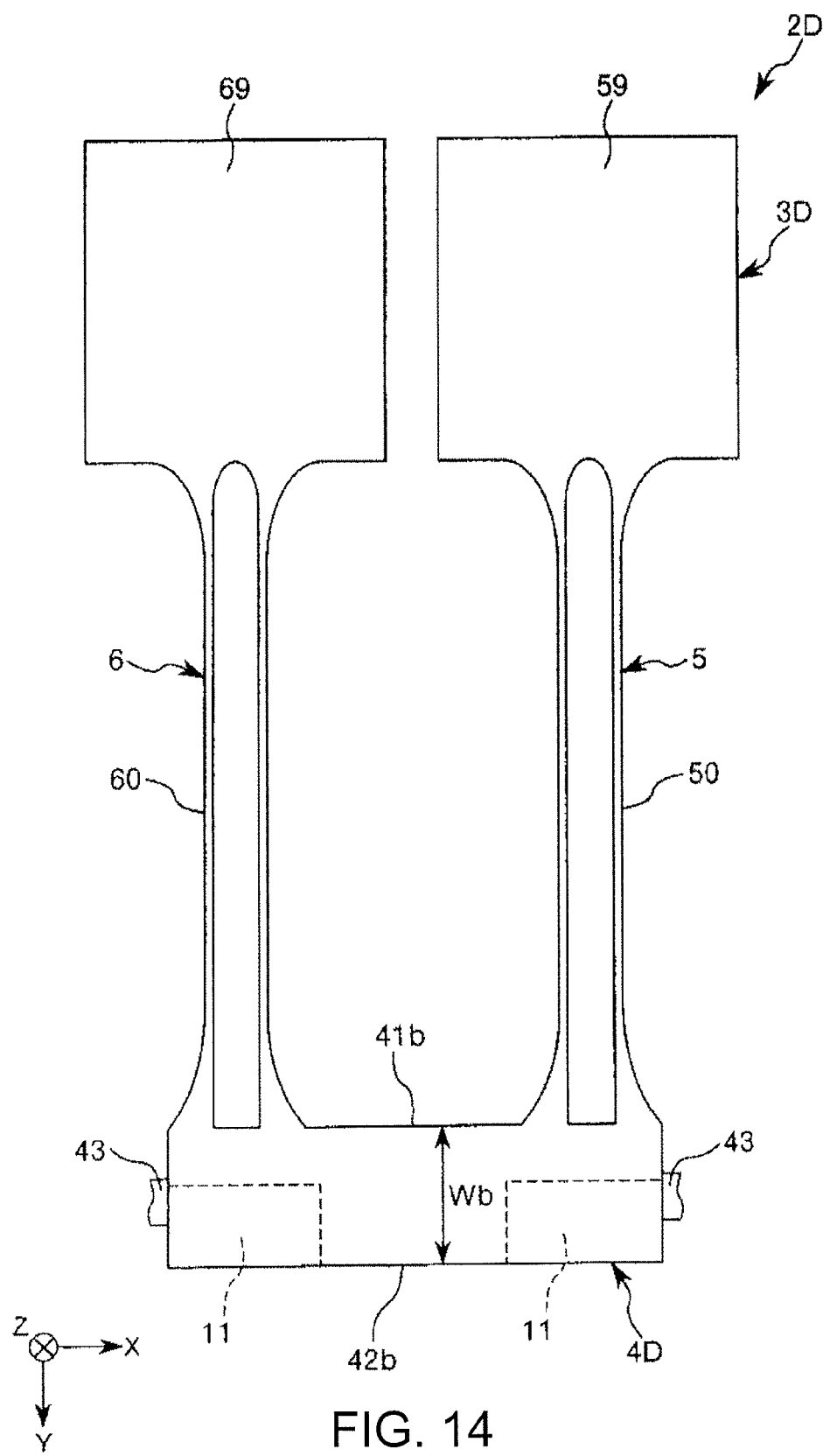
FIG. 14 is a plan view (top view) illustrating Modification Example 3 of the resonator element according to the first embodiment of the invention.

FIG. 12 is a plan view (top view) illustrating Modification Example 1 of the resonator element according to the first embodiment of the invention, FIG. 13 is a plan view (top view) illustrating Modification Example 2 of the resonator element according to the first embodiment of the invention, and FIG. 14 is a plan view (top view) illustrating Modification Example 3 of the resonator element according to the first embodiment of the invention.

Hereinafter, the modification examples of the first embodiment will be described focusing on different points from the above-described first embodiment, and description relating to the same content will not be repeated. In FIGS. 12 to 14, the same reference numerals are given to the same configurations as in the above-described first embodiment.

A quartz crystal substrate 3B provided for a resonator element 2B of Modification Example 1 shown in FIG. 12 includes a base 4B instead of the above-described base 4. The base 4B is the same as the base 4, except that the width reduction portion 41 is not provided. In the resonator element 2B, similarly, the relationship between the shortest distance Wb between a first end surface 41b of the base 4B and a second end surface 42a thereof and the effective width We satisfies the above-described relationship, and thus, it is possible to reduce the thermoelastic loss of the resonator element 2B while achieving miniaturization of the resonator element 2B in the extension direction of the vibrating arms 5 and 6.

A quartz crystal substrate 3C provided for a resonator element 2C of Modification Example 2 shown in FIG. 13 includes a base 4C instead of the above-described base 4. The base 4C is the same as the base 4, except that the width reduction portion 42 is not provided. In the resonator element 2C, similarly, the relationship between the shortest distance Wb between a first end surface 41a of the base 4C and a second end surface 42a thereof and the effective width We satisfies the above-described relationship, and thus, it is possible to reduce the thermoelastic loss of the resonator element 2C while achieving miniaturization of the resonator element 2C in the extension direction of the vibrating arms 5 and 6.

A quartz crystal substrate 3D provided for a resonator element 2D of Modification Example 3 shown in FIG. 14 includes a base 4D instead of the above-described base 4. The base 4D is the same as the base 4, except that the width reduction portions 41 and 42 are not provided and the protruding portions 43 are respectively provided on both end portions in the X axis direction. In the resonator element 2D, similarly, the relationship between the shortest distance Wb between a first end surface 41b of the base 4D and a second end surface 42b thereof and the effective width We satisfies the above-described relationship, and thus, it is possible to reduce the thermoelastic loss of the resonator element 2D while achieving miniaturization of the resonator element 2D in the extension direction of the vibrating arms 5 and 6.

Second Embodiment

Next, the second embodiment of the invention will be described.

Figure 15:
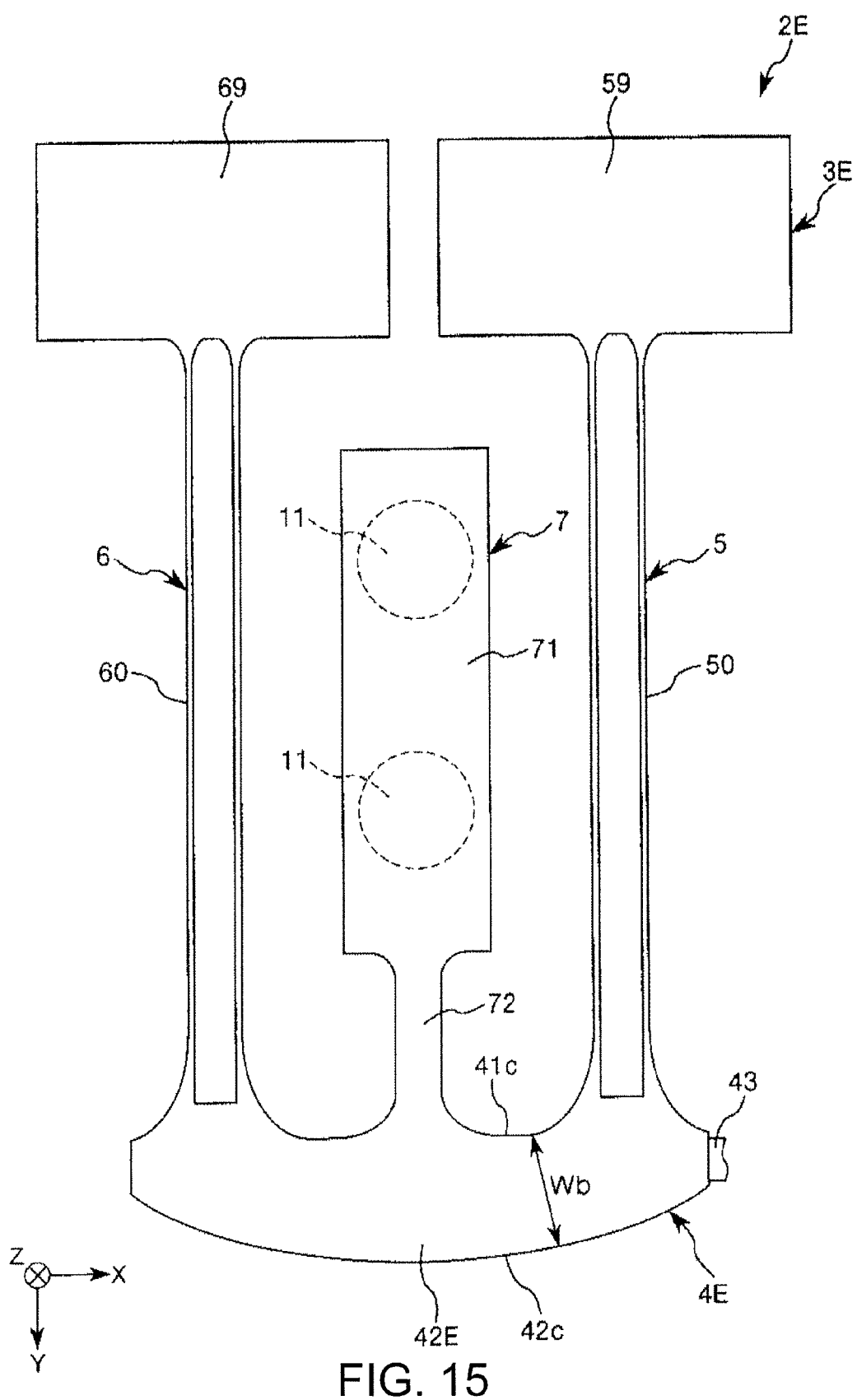
FIG. 15 is a plan view (top view) illustrating a resonator element according to a second embodiment of the invention.
Figure 16:
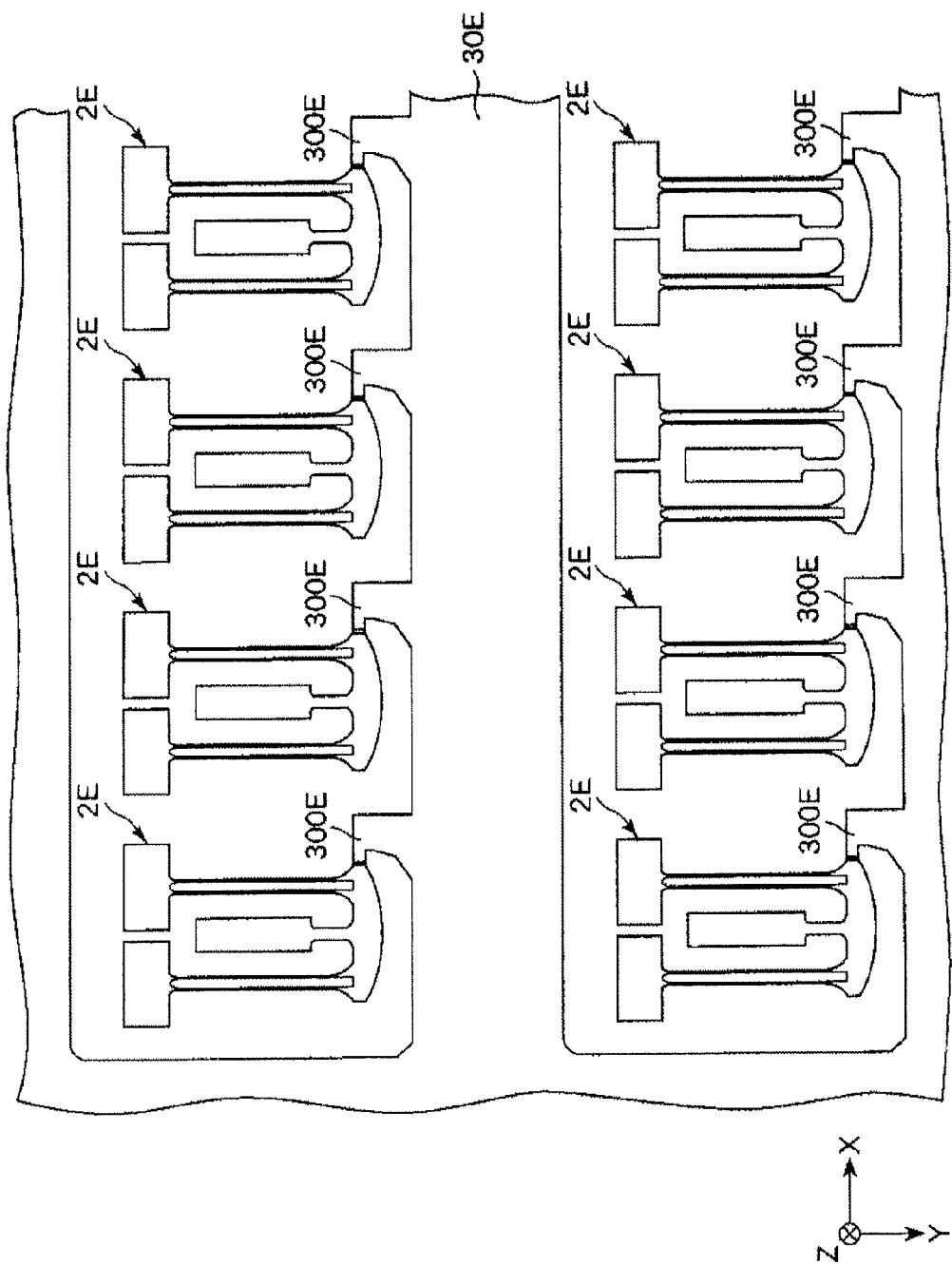
FIG. 16 is a diagram illustrating a breaking portion of the resonator element shown in FIG. 15.
Figure 17B:
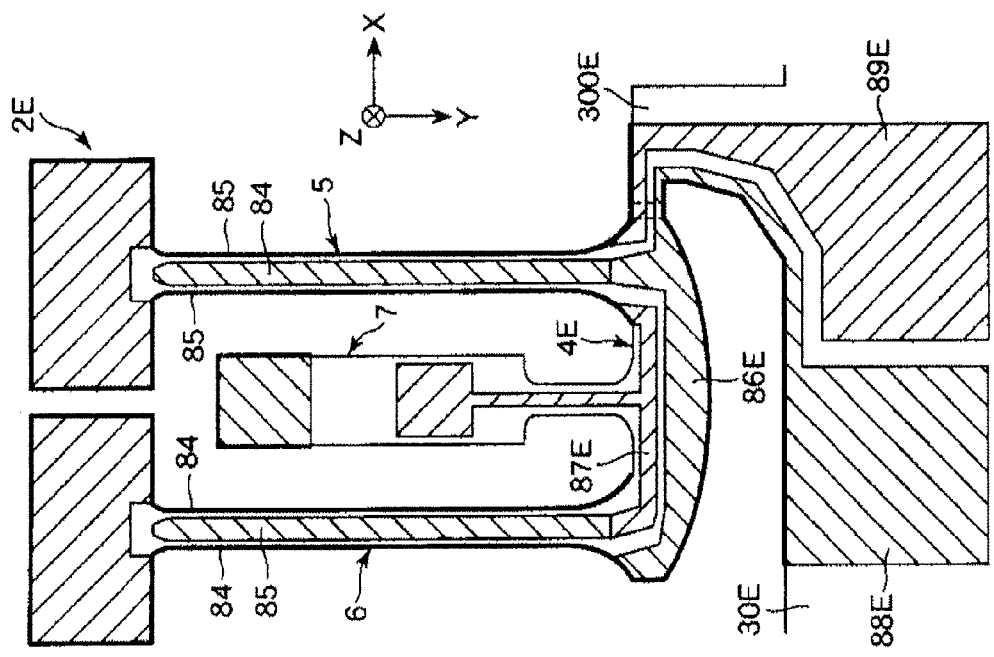
FIGS. 17A and 17B are a top view and a bottom (perspective) view illustrating an electrode configuration and the breaking portion of the resonator element shown in FIG. 15.
Figure 17A:
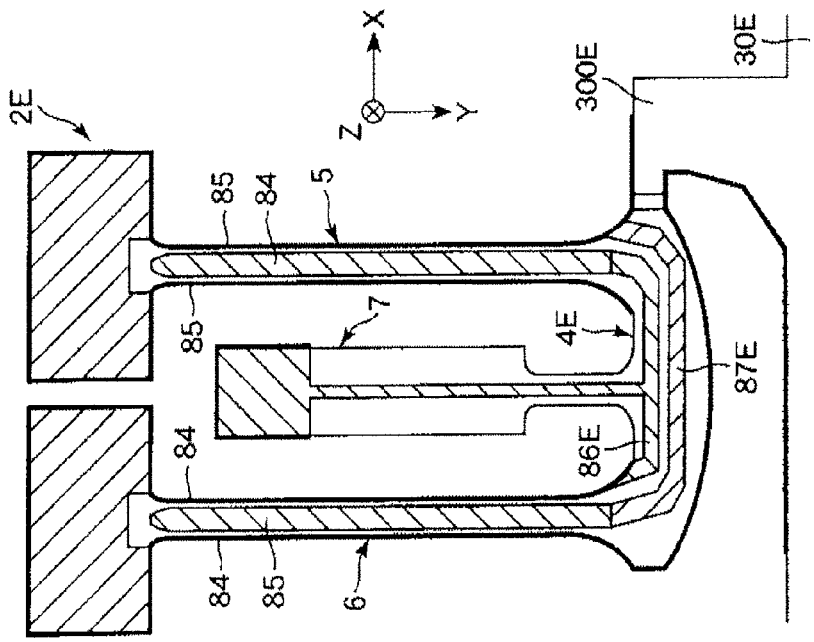

FIG. 15 is a plan view (top view) illustrating a resonator element according to the second embodiment of the invention. FIG. 16 is a diagram illustrating a breaking portion of the resonator element shown in FIG. 15. Further, FIGS. 17A and 17B are a top view and a bottom (perspective) view illustrating an electrode configuration and the breaking portion of the resonator element shown in FIG. 15.

Hereinafter, the second embodiment will be described focusing on different points from the above-described embodiments, and description relating to the same content will not be repeated.

The second embodiment is approximately the same as the first embodiment, except that a supporting arm is provided. In FIGS. 15 to 17, the same reference numerals are given to the same configurations as in the above-described embodiments.

A resonator element 2E shown in FIG. 15 includes a quartz crystal substrate 3E, first drive electrodes 84, and second drive electrodes 85 (see FIGS. 17A and 17B) formed on the quartz crystal substrate 3E.

The quartz crystal substrate 3E includes a base 4E, a pair of vibrating arms 5 and 6 that extends from the base 4E, and a supporting arm 7 that extends from the base 4E between the pair of vibrating arms 5 and 6.

The base 4E includes a width reduction portion 42E provided in an end portion on the +Y axis direction side.

A protruding portion 43 is provided as a breaking mark in an end portion of the base 4E on the +X axis direction side. Further, a width reduction portion 42E that suppresses vibration leakage is provided in an end portion of the base 4E opposite to the vibrating arms 5 and 6. On the other hand, the supporting arm 7 extends in the end portion of the base 4E on the side of the vibrating arms 5 and 6.

The supporting arm 7 extends from the base 4E in the −Y axis direction, and is disposed between the vibrating arms 5 and 6. The supporting arm 7 includes a main body 71, and a connecting portion 72 that connects the main body 71 to the base 4E. The supporting arm 7 is configured so that a surface of the main body 71 on the +Z axis direction side is fixed and supported to a package (not shown) through a pair of bonding materials 11.

In the present embodiment, the width of the connecting portion 72 along the X axis direction is set to be smaller than the width of the main body 71 along the X axis direction. Thus, it is possible to suppress vibration transmission from the base 4E to the main body 71, and consequently, to reduce vibration leakage. The width of the connecting portion 72 along the X axis direction may be the same as the width of the main body 71 in the X axis direction, and may have a portion larger than the width of the main body 71 along the X axis direction.

Further, the main body 71 includes the center of gravity G of the resonator element 2E in the planar view. Thus, since a fixing portion can be set at a position close to the center of gravity G of the resonator element 2E, it is easy to control posture during fixing. Further, it is possible to effectively use a space between the pair of vibrating arms 5 and 6 as an arrangement space of the supporting arm 7, and consequently, to prevent a size increase of the resonator element 2E.

In addition, a tip end of the supporting arm 7 is disposed on the +Y axis direction side (on the side of the base 4E) with reference to the hammer heads 59 and 69 of the vibrating arms 5 and 6. Thus, the space between the vibrating arms 5 and 6 can be effectively used as the arrangement space of the supporting arm 7. The length of the supporting arm 7 along the Y axis direction may be the same as the length of the vibrating arms 5 and 6 along the Y axis direction, and may be longer than the length of the vibrating arms 5 and 6 in the Y axis direction.

In the resonator element 2E, similarly, the relationship between the shortest distance Wb between a first end surface 41c and a second end surface 42c of the base 4E, and the effective width We satisfies the above-described relationship, and it is thus possible to reduce thermoelastic loss of the resonator element 2E while achieving miniaturization of the resonator element 2E in the extending direction of the vibrating arms 5 and 6.

Particularly, in the resonator element 2E, by providing the supporting arm 7, it is possible to suppress vibration leakage caused by flexural vibration of the vibrating arms 5 and 6. Thus, it is possible to obtain the resonator element 2E with a high Q value.

Further, as the supporting arm 7 is disposed between one pair of vibrating arms 5 and 6, since a portion where the resonator element 2E is supported and fixed becomes a central portion of the resonator element 2E, it is possible to shorten the entire length of the resonator element 2E, and to achieve miniaturization of the resonator element 2E.

In addition, as shown in FIGS. 16 and FIGS. 17A and 17B, the resonator element 2E is obtained by etching a quartz crystal wafer to form an appearance with a part of the base 4E being connected to a base material 30E of the wafer through a breaking portion 300E, and then, by breaking the breaking portion 300E. The protruding portion 43 is a breaking mark formed by breaking the breaking portion 300E.

Here, before the breaking is performed in the breaking portion 300E, plural vibration pieces 2E are arranged in the X axis direction. Further, on both of the surfaces of the base 4E, a wiring 86E that electrically connects the first drive electrodes 84, and a wiring 87E that electrically connects the second drive electrodes 85 are provided. Further, a pair of inspection electrodes 88E and 89E is provided on one surface of the base material 30E for each resonator element 2E. Before the breaking is performed in the breaking portion 300E, the electrode 88E is electrically connected to the first drive electrode 84, and the electrode 89E is electrically connected to the second drive electrode 85.

The breaking portion 300E can have the same configuration as that of the breaking portion 300 of the above-described first embodiment.

Modification Examples of Breaking Portion

Hereinafter, modification examples of the breaking portion used in the resonator element 2E of the second embodiment will be described.

Figure 18:
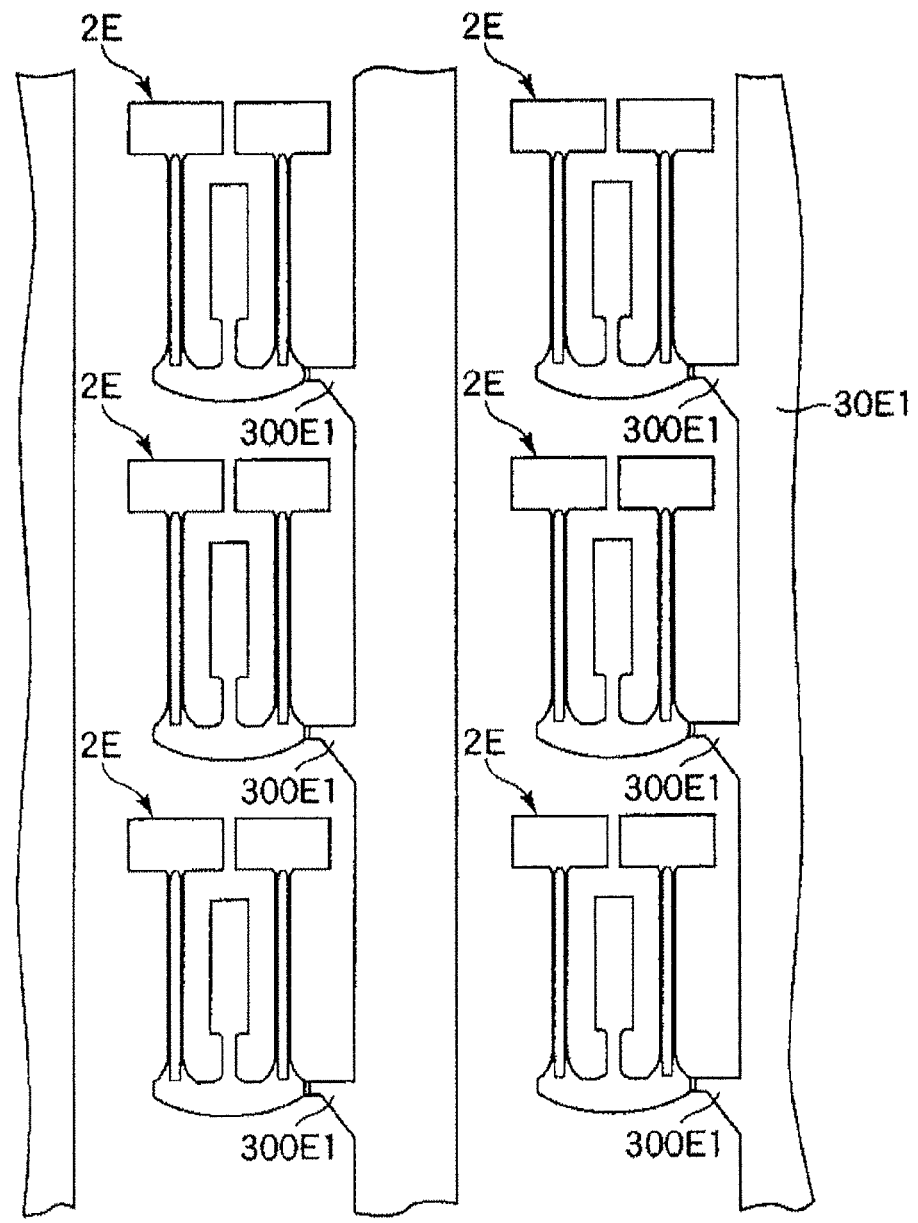
FIG. 18 is a diagram illustrating a modification example of the breaking portion of the resonator element shown in FIG. 15.

FIG. 18 is a diagram illustrating a modification example of the breaking portion of the resonator element shown in FIG.

15. Further, FIGS. 19A and 19B are a top view and a bottom (perspective) view illustrating a modification example of the electrode configuration and the breaking portion of the resonator element shown in FIG. 15.

In FIG. 18 and FIGS. 19A and 19B, the resonator element 2E is obtained by etching a quartz crystal wafer to form an appearance with a part of the base 4E being connected to a base material 30E1 of the wafer through a breaking portion 300E1, and then, by breaking the breaking portion 300E1.

Here, before the breaking is performed in the breaking portion 300E1, plural vibration pieces 2E are arranged in the Y axis direction. Further, on both of the surfaces of the base 4E, the wiring 86E that electrically connects the first drive electrodes 84, and the wiring 87E that electrically connects the second drive electrodes 85 are provided. Further, a pair of inspection electrodes 88E1 and 89E1 is provided on one surface of the base material 30E1 for each resonator element 2E. Before the breaking is performed in the breaking portion 300E1, the electrode 88E1 is electrically connected to the first drive electrode 84, and the electrode 89E1 is electrically connected to the second drive electrode 85.

The breaking portion 300E1 according to this modification example protrudes from the base material 30 in the X axis direction. Thus, it is possible to efficiently arrange the plural resonator elements 2E on the wafer in the Y axis direction.

Modification Examples of Resonator Element of the Second Embodiment

Hereinafter, modification examples of the resonator element according to the above-described second embodiment will be described.

Figure 20:
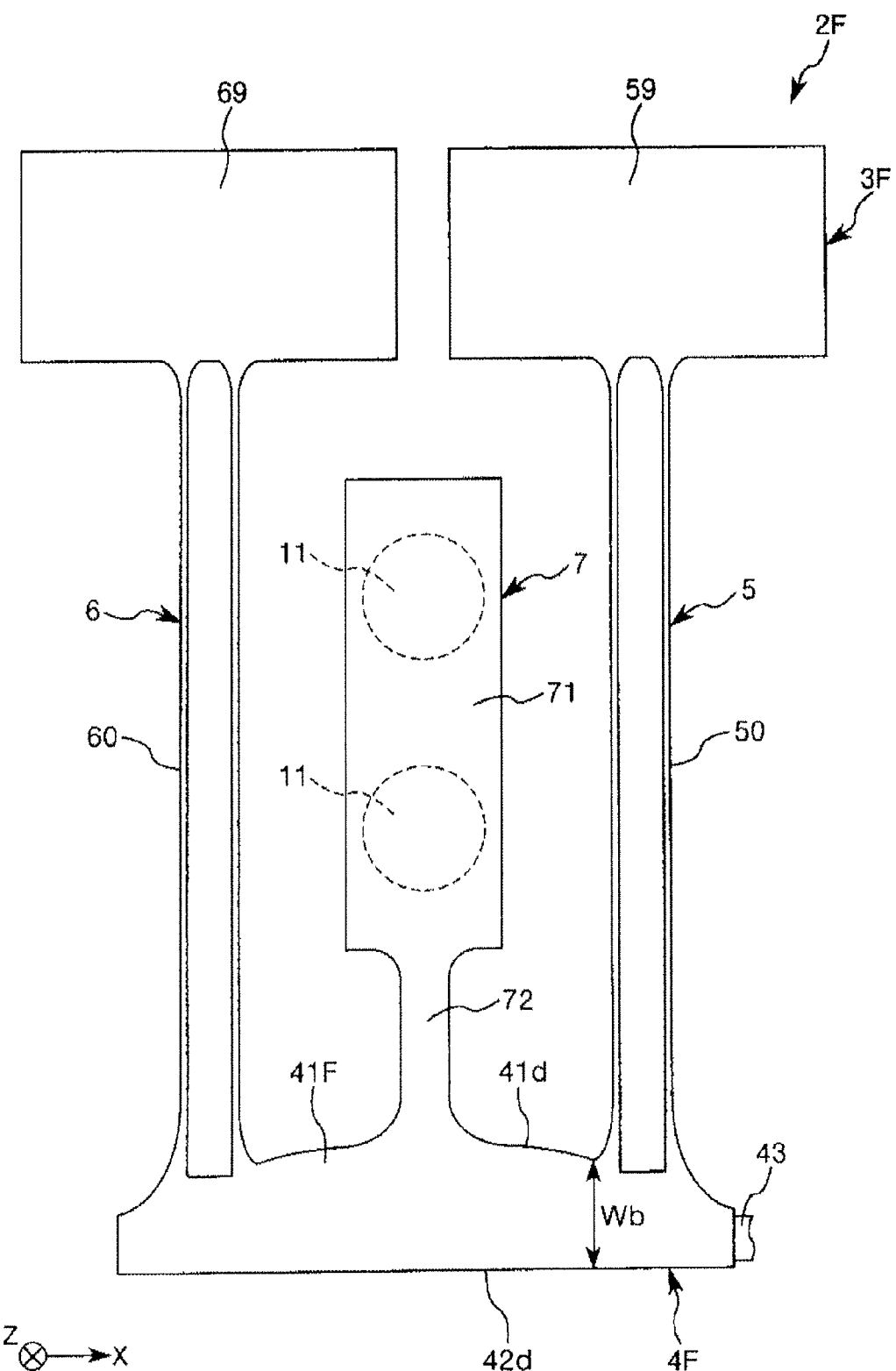
FIG. 20 is a plan view (top view) illustrating Modification Example 1 of the resonator element according to the second embodiment of the invention.
Figure 21:
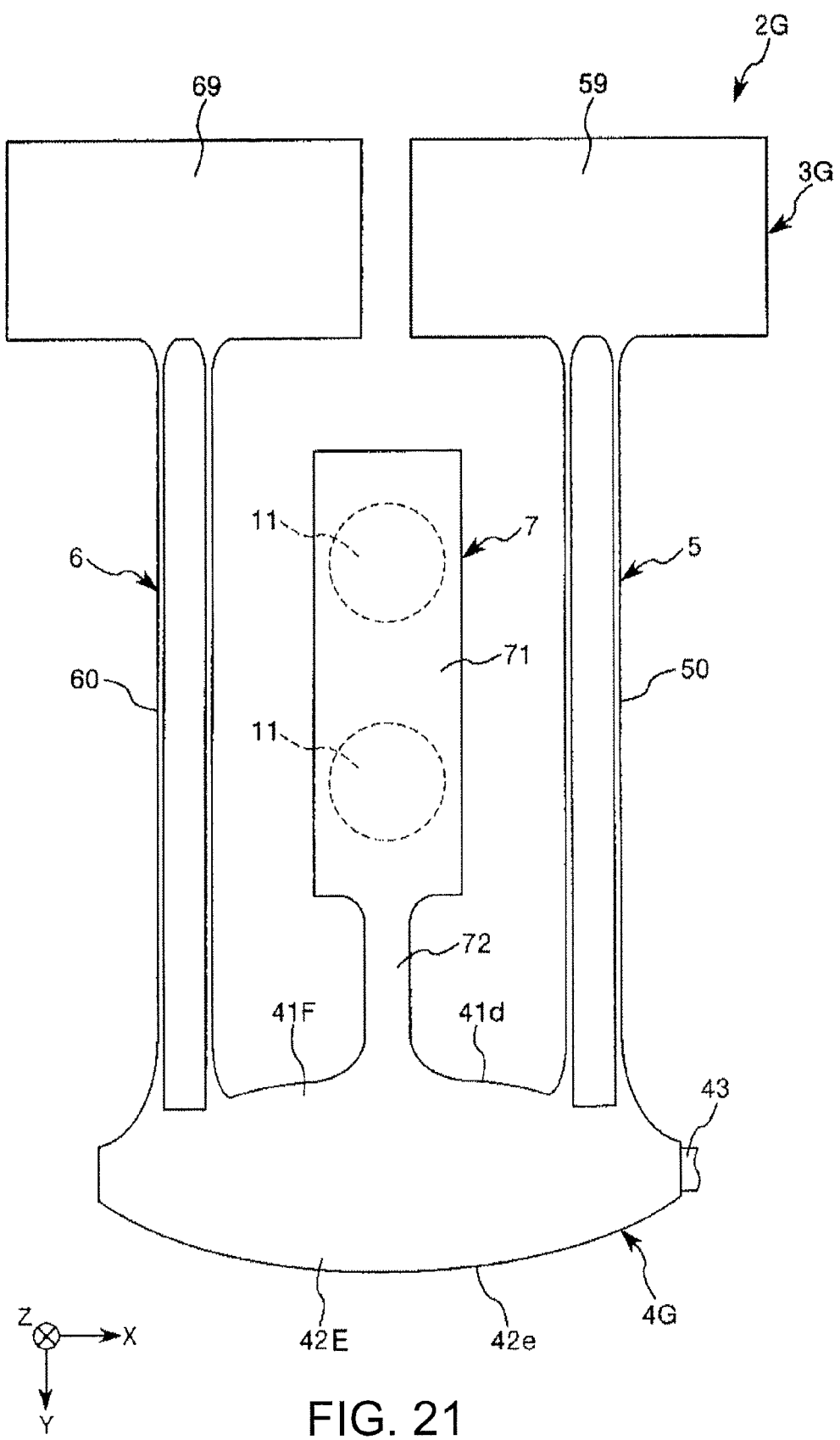
FIG. 21 is a plan view (top view) illustrating Modification Example 2 of the resonator element according to the second embodiment of the invention.

FIG. 20 is a plan view (top view) illustrating Modification Example 1 of the resonator element according to the second embodiment of the invention, and FIG. 21 is a plan view (top view) illustrating Modification Example 2 of the resonator element according to the second embodiment of the invention.

Hereinafter, the modification examples of the second embodiment will be described focusing on different points from the above-described embodiments, and description relating to the same content will not be repeated. In FIGS. 20 to 21, the same reference numerals are given to the same configurations as in the above-described embodiments.

A crystal quartz substrate 3F provided for a resonator element 2F of Modification Example 1 shown in FIG. 20 includes a base 4F instead of the above-described base 4E. The base 4F is the same as the base 4E, except that the width reduction portion 42 is not provided and a width reduction portion 41F is provided in an end portion of the base 4E on the −Y axis direction side. In the resonator element 2F, similarly, the relationship between the shortest distance Wb between a first end surface 41d of the base 4F and a second end surface 42d thereof and the effective width We satisfies the above-described relationship, and thus, it is possible to reduce thermoelastic loss of the resonator element 2F while achieving miniaturization of the resonator element 2F in the extension direction of the vibrating arms 5 and 6.

A crystal quartz substrate 3G provided for a resonator element 2G of Modification Example 2 shown in FIG. 21 includes a base 4G instead of the above-described base 4E. The base 4G is the same as the base 4E, except that the width reduction portion 41F is provided in the end portion of the base 4E on the −Y axis direction side. In the resonator element 2G, similarly, the relationship between the shortest distance Wb between a first end surface 41d of the base 4G and a second end surface 42e thereof and the effective width We satisfies the above-described relationship, and thus, it is possible to reduce thermoelastic loss of the resonator element 2G while achieving miniaturization of the resonator element 2G in the extension direction of the vibrating arms 5 and 6.

2. Resonator

Next, a resonator to which the resonator element according to the invention is applied will be described.

Figure 22A:
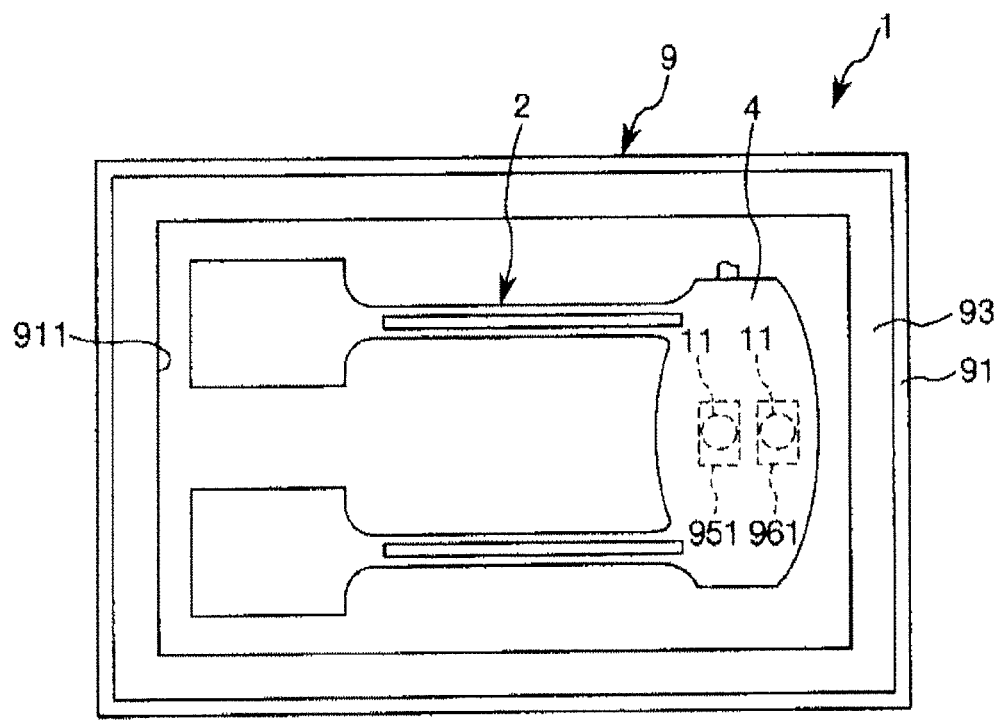
FIGS. 22A and 22B are a plan view and a sectional view illustrating a schematic configuration of an example of a resonator according to the invention.
Figure 22B:
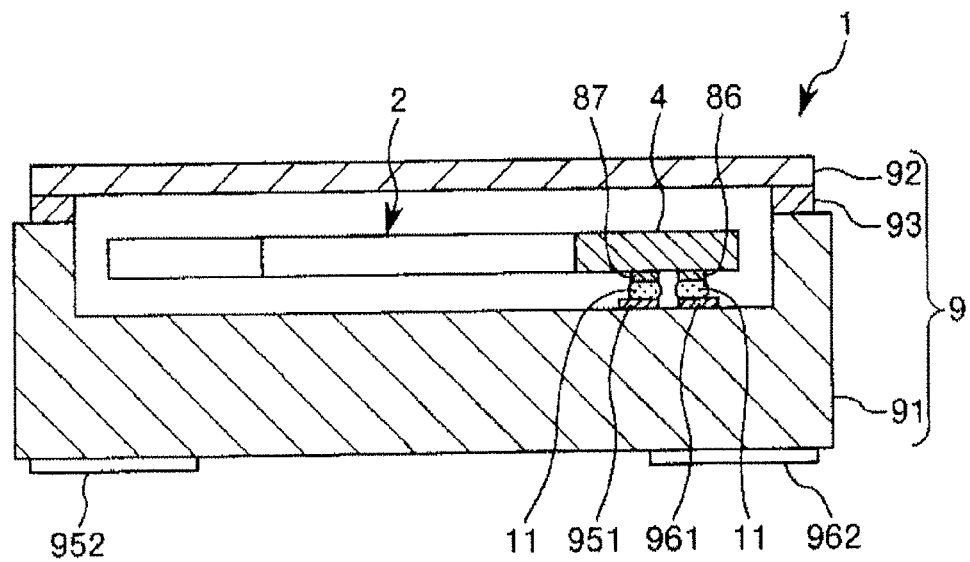

FIGS. 22A and 22B are a plan view and a sectional view illustrating a schematic configuration of an example of a resonator according to the invention. For ease of description, in FIG. 22A, a cover member is not shown.

As shown in FIGS. 22A and 22B, a resonator 1 includes the resonator element 2 of the above-described first embodiment, and a package 9 as a container that accommodates the resonator element 2.

The package 9 includes a package base 91 provided with a concave portion 911 formed in an approximately rectangular shape in the planar view, and a flat-plate lid (cover) 92 that covers the concave portion 911 of the package base 91, and is formed in an approximately rectangular parallelepiped shape.

As a material of the package base 91, a ceramic-based insulating material such as an aluminum oxide sintered body, a mullite sintered body, an aluminum nitride sintered body, a silicon carbide sintered body, or a glass ceramic sintered body obtained by forming, laminating, and sintering a ceramic green sheet, quartz crystal, glass, silicon (high-resistivity silicon), or the like may be used.

As a material of the lid 92, the same material as that of the package base 91, Kovar, 42 alloy, or the like may be used.

On an inner bottom surface (inner bottom base) of the concave portion 911 of the package base 91, inner terminals 951 and 961 are provided at positions that face mount electrodes (wirings 86 and 86 provided on the surface of the base 4 on the +Z axis direction side) as terminal electrodes extracted from excitation electrodes (not shown) of the resonator element 2 to the base 4.

The resonator element 2 is configured so that the mount electrodes are bonded to the inner terminals 951 and 961 through the conductive bonding material 11 using a conductive adhesive of a epoxy base, a silicone base, a polyimide base, an acrylic base, a bismaleimide base, or the like in which a conductive material such as a metal filler is mixed, a metallic bump such as gold (Au), aluminum (Al) or soldering bump, a metallic layer, and a resin bump in which a metallic wiring is formed on a resin core.

The resonator element attached to the package 9 using the adhesive or bump in this way is advantageous for miniaturization, compared with a case where the connection is performed through a lead terminal. Accordingly, by applying the resonator element 2 to the resonator 1 provided with the above-described resonator element, it is possible to achieve excellent characteristics with a small size.

On an outer bottom surface (outer bottom base) of the package base 91 opposite to the concave portion 911, electrode terminals 952 and 962 are provided.

The electrode terminals 952 and 962 are electrically connected to the inner terminals 951 and 961 using inner wirings (not shown). Specifically, the electrode terminal 952 is electrically connected to the inner terminal 951, and the electrode terminal 962 is electrically connected to the inner terminal 961.

The inner terminals 951 and 961 and the electrode terminals 952 and 962 are formed by a metal coating having a configuration in which each film made of nickel (Ni), gold (Au), or the like is laminated by plating or the like on a metalized layer made of tungsten (W), molybdenum (Mo), or the like.

The lid 92 is bonded to the package base 91 through a bonding member 93 such as a seam ring, a low melting point glass, or an adhesive. Thus, the concave portion 911 of the package base 91 is sealed to be airtight. It is preferable that the space sealed to be airtight is in a decompressed vacuum state (state where the degree of vacuum is high) so as not to interrupt flexural vibration of the resonator element 2.

The package 9 may be configured by a flat-plate package base and a lid having a concave portion or the like, or may have a configuration in which a concave portion is provided on both sides of the package base and the lid.

According to the above-described resonator 1, it is possible to obtain excellent characteristics with a small size. Further, the resonator 1 can be used as a sensor. In this case, it is possible to provide a sensor with a small size and an excellent characteristic.

3. Oscillator

Next, an oscillator to which the resonator element according to the invention is applied will be described.

Figure 23A:
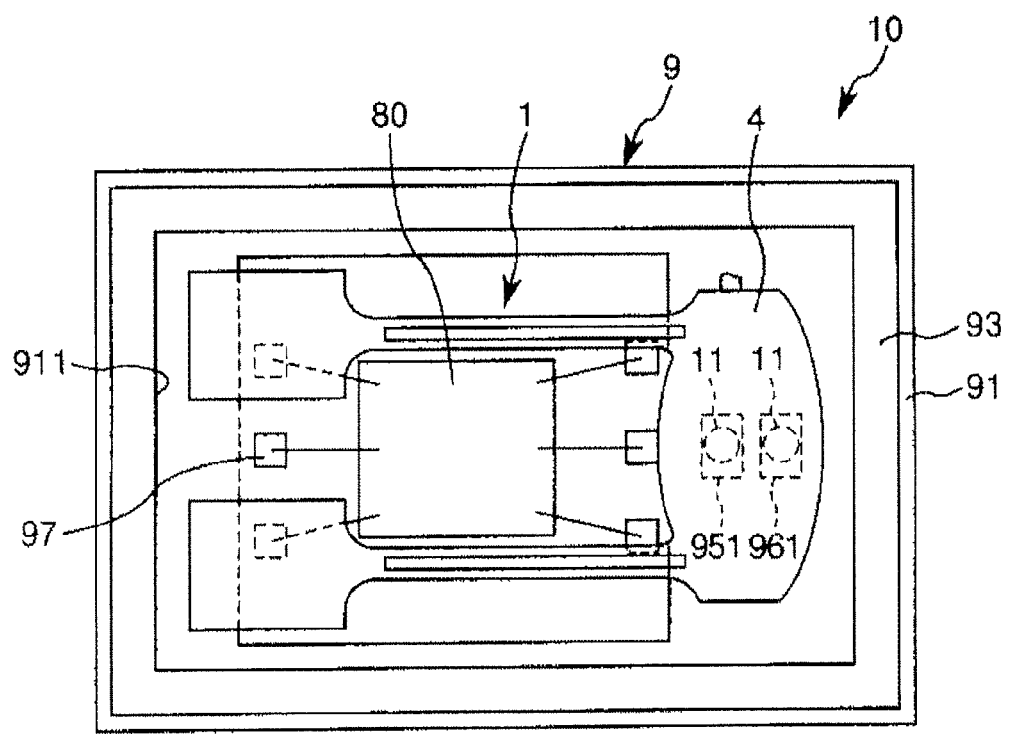
FIGS. 23A and 23B are a plan view and a sectional view illustrating a schematic configuration of an example of an oscillator according to the invention.
Figure 23B:
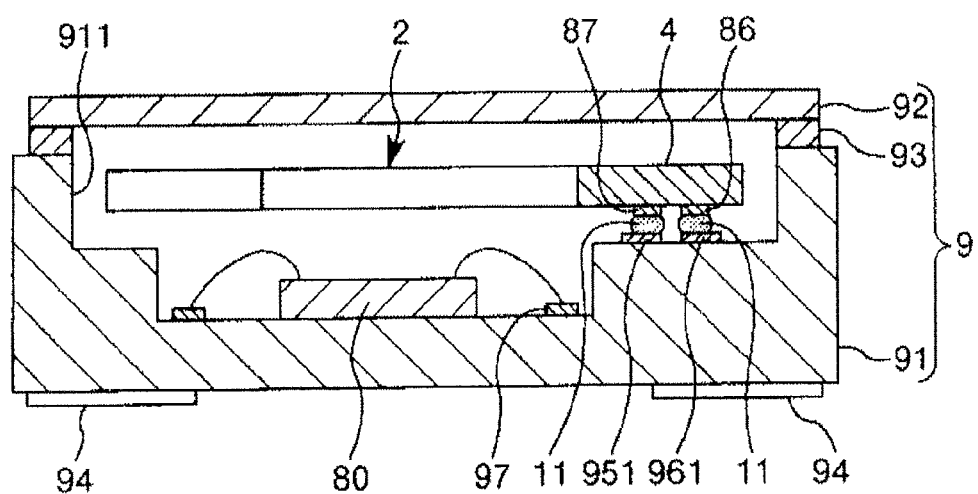

FIGS. 23A and 23B are a plan view and a sectional view illustrating a schematic configuration of an example of an oscillator according to the invention.

Hereinafter, the oscillator will be described focusing on different points from the above-described resonator, and description relating to the same content will not be repeated. In FIGS. 23A and 23B, the same reference numerals are given to the same configurations as in the above-described resonator.

An oscillator 10 shown in FIGS. 23A and 23B includes the resonator element 2 according to the above-described first embodiment, an IC chip 80 which is an oscillation circuit for oscillating (driving) the resonator element 2, and a package 9 that accommodates the resonator element 2 and the IC chip 80.

On an inner bottom surface of the concave portion 911 of the package base 91, an accommodating portion of the IC chip 80 formed in a concave shape is provided. The IC chip 80 in which the oscillating circuit is built is fixed to a bottom surface of the accommodating portion of the package base 91 using adhesive (unknown) or the like.

The IC chip 80 is provided so that a connecting pad thereof (not shown) is electrically connected to an inner connecting terminal 97 provided in the accommodating portion by a metallic wire made of gold (Au), aluminum (Al), or the like.

The inner connecting terminal 97 is formed by a metal coating having a configuration in which each film made of nickel (Ni), gold (Au), or the like is laminated by plating or the like on a metalized layer made of tungsten (W), molybdenum (Mo), or the like, and the inner connecting terminal 97 is electrically connected to the electrode terminal 94 provided on the four corners of the outer bottom surface, the inner terminals 951, 961 or the like through the inner wiring (not shown).

The connection of the connecting pad of the IC chip 80 and the inner connecting terminal 97 may be performed by a connection method of flip-chip mounting using flipping of the IC chip 80, in addition to the connection method of wire bonding using the metallic wire.

Further, the IC chip 80 may be mounted in a concave portion provided on the outer bottom surface of the package 9, and may be sealed by a molding material.

According to the oscillator 10 as described above, it is possible to achieve excellent characteristics with a small size.

4. Electronic Apparatus

Next, an electronic apparatus to which the resonator element according to the invention is applied will be described with reference to FIGS. 24 to 26.

Figure 24:
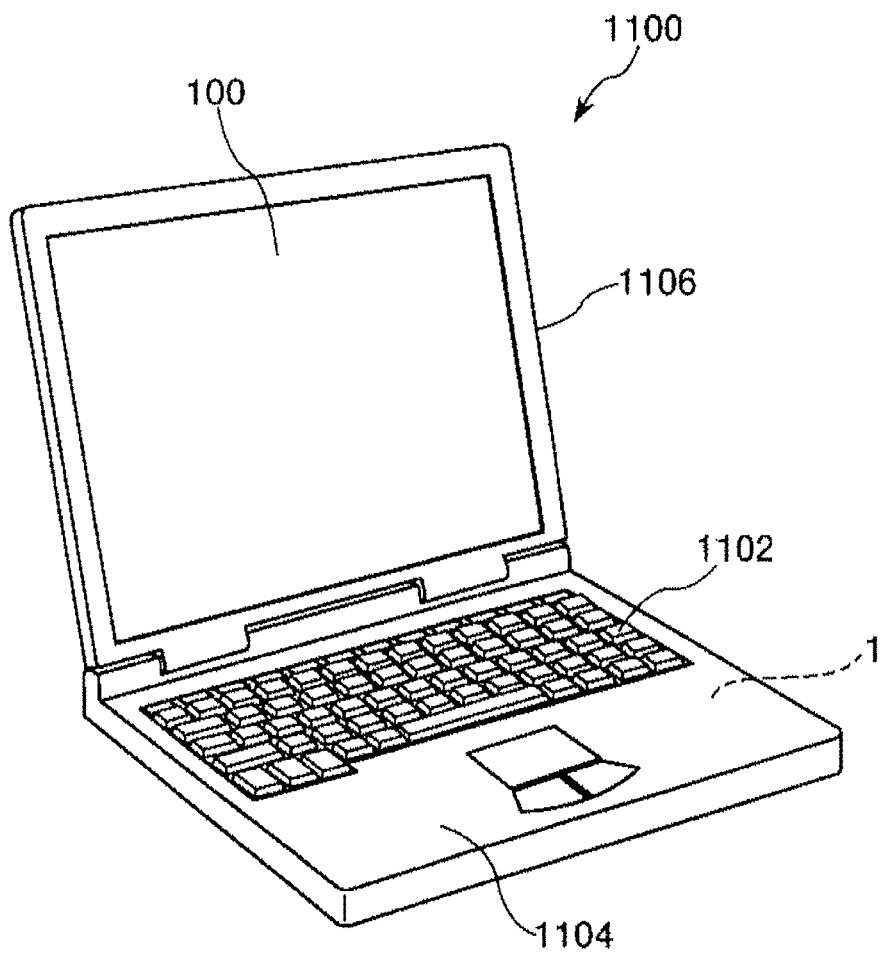
FIG. 24 is a perspective view illustrating a configuration of a mobile (notebook-type) personal computer which is a first example of an electronic apparatus according to the invention.

FIG. 24 is a perspective view illustrating a configuration of a mobile (notebook-type) personal computer which is a first example of the electronic apparatus according to the invention.

In FIG. 24, a personal computer 1100 includes a main body 1104 provided with a keyboard 1102, and a display unit 1106 provided with a display portion 100, in which the display unit 1106 is supported to the main body 1104 to be rotatable through a hinge structure. The oscillator 10 (resonator element 2) is built in the personal computer 1100.

Figure 25:
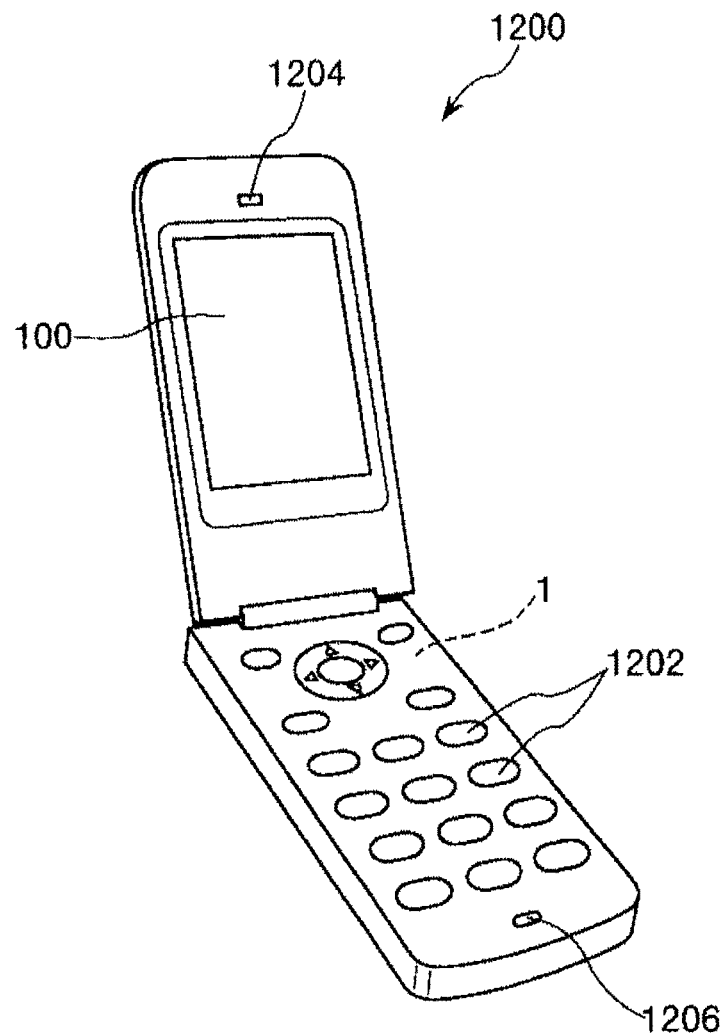
FIG. 25 is a perspective view illustrating a configuration of a mobile phone (including PHS) which is a second example of the electronic apparatus according to the invention.

FIG. 25 is a perspective view illustrating a configuration of a mobile phone (including PHS) which is a second example of the electronic apparatus according to the invention.

In FIG. 25, a mobile phone 1200 includes plural operation buttons 1202, an ear piece 1204, and a mouthpiece 1206, and a display portion 100 is disposed between the operation buttons 1202 and the ear piece 1204. The oscillator 10 (resonator element 2) is built in the mobile phone 1200.

Figure 26:
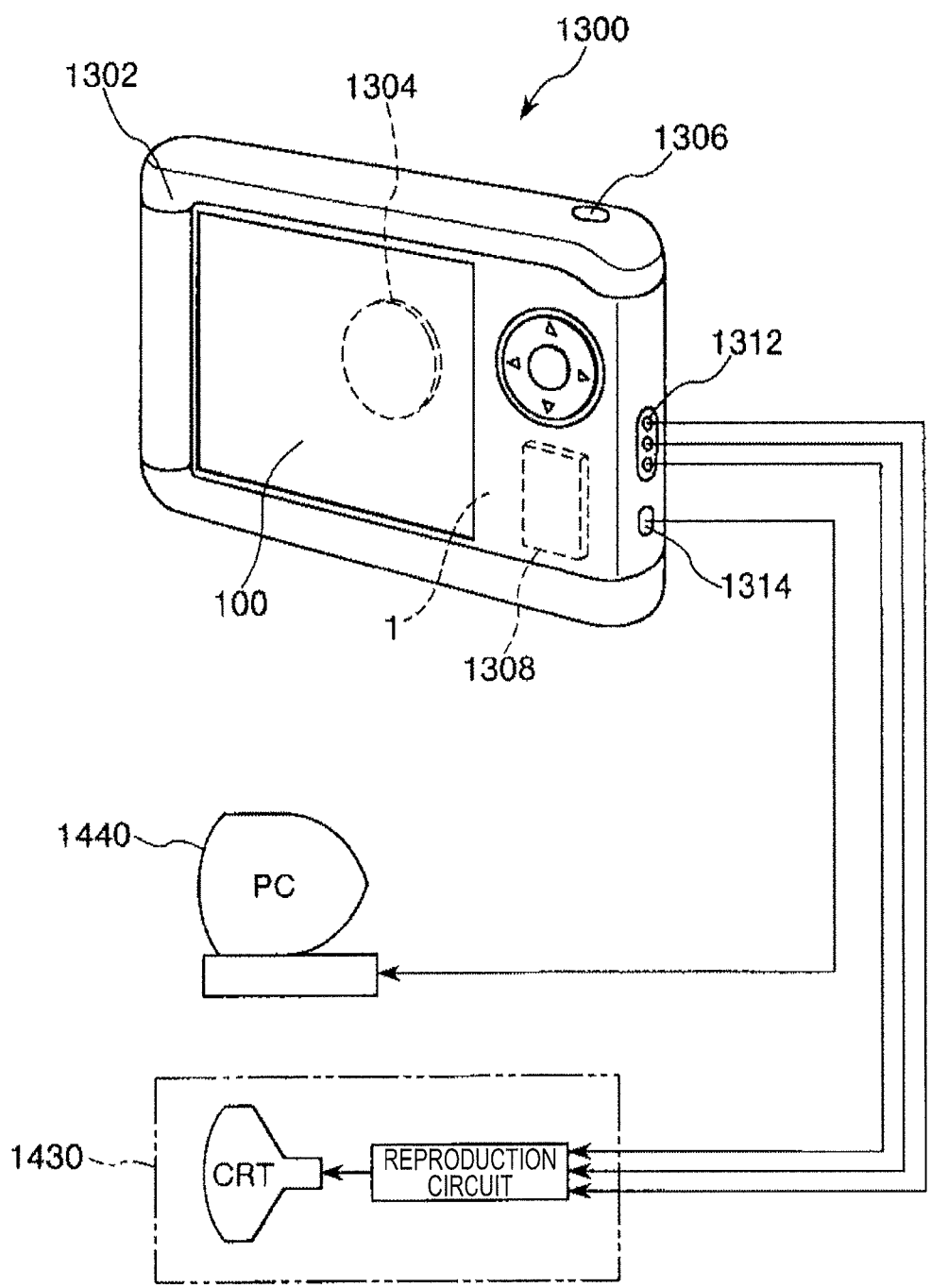
FIG. 26 is a perspective view illustrating a configuration of a digital camera which is a third example of the electronic apparatus according to the invention.

FIG. 26 is a perspective view illustrating a configuration of a digital camera which is a third example of the electronic apparatus according to the invention. In FIG. 26, connection to an external device is also simply shown.

Here, an ordinary camera has a configuration in which a silver-halide photo film is exposed using a light image of an object, whereas a digital camera 1300 has a configuration in which a light image of an object is photo-electrically converted by an imaging element such as a charge coupled device (CCD) to generate an imaging signal (image signal).

In the digital camera 1300, a display portion 100 is provided on a rear surface of a case (body) 1302 to perform display based on the imaging signal obtained by the CCD. The display portion 100 functions as a finder that displays the object as an electronic image. Further, a light receiving unit 1304 that includes an optical lens (imaging optical system), a CCD, or the like is provided on a front surface side (rear surface side in the figure) of the case 1302.

If a user checks an object image displayed in the display portion 100 and presses a shutter button 1306, an imaging signal of the CCD at that time is transmitted to and stored in a memory 1308. Further, in the digital camera 1300, a video signal output terminal 1312, and a data communication input/output terminal 1314 are provided on a side surface of the case 1302. In addition, as shown in the figure, a television monitor 1430 is connected to the video signal output terminal 1312, and a personal computer (PC) 1440 is connected to the data communication input/output terminal 1314, as necessary. Furthermore, the imaging signal stored in the memory 1308 is output to the television monitor 1430 or the personal computer 1440 by a predetermined operation. The oscillator 10 (resonator element 2) is built in the digital camera 1300.

According to the above-described electronic apparatus, excellent reliability is obtained.

The electronic apparatus provided with the resonator element according to the invention may be applied to an ink jet ejection device (for example, an ink jet printer), a personal computer, a television, a video camera, a video tape recorder, a car navigation device, a pager, an electronic organizer (including a communication function), an electronic dictionary, a calculator, an electronic game machine, a word processor, a work station, a television phone, a security TV monitor, electronic binoculars, a POS terminal, a medical device (for example, an electronic thermometer, a blood manometer, a blood sugar level meter, an electrocardiographic measuring device, an ultrasonic diagnostic device, or an electronic endoscope), a fish-finder, a variety of measuring devices, a meter (for example, a meter for a vehicle, an airplane, or a ship), a flight simulator, or the like, for example, in addition to the personal computer (mobile personal computer) shown in FIG. 24, the mobile phone shown in FIG. 25, and the digital camera shown in FIG. 26.

5. Mobile Object

Figure 27:
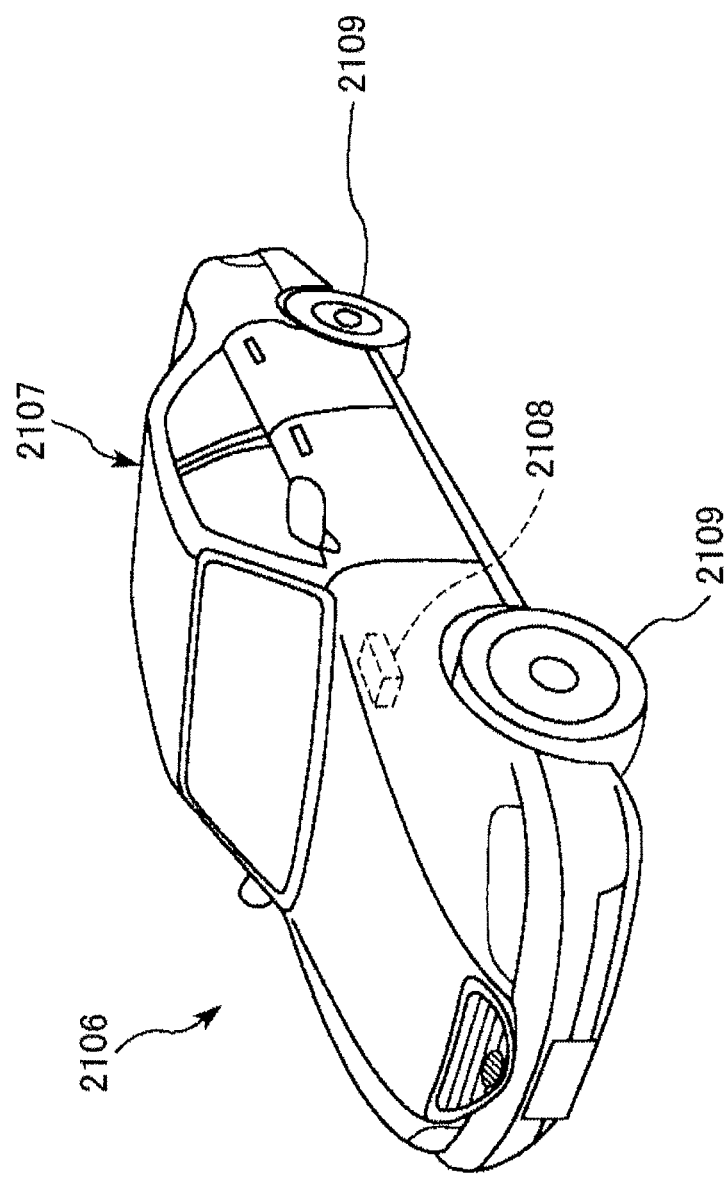
FIG. 27 is a perspective view illustrating a configuration of an automobile which is an example of a mobile object according to the invention.

FIG. 27 is a perspective view illustrating an automobile configuration which is an example of a mobile object according to the invention.

In FIG. 27, the oscillator 10 (resonator element 2) is built in an electronic control unit 2108 that controls a tire 2109, which is mounted in a car body 2107.

The resonator provided with the resonator element according to the invention or the oscillator is mounted in an automobile 2106, and for example, may be widely applied to an electronic control unit (ECU) 2108 such as a keyless entry, an immobilizer, a car navigation system, a car air-conditioner, an anti-lock braking system (ABS), an air bag, a tire pressure monitoring system (TPMS), an engine controller, a battery monitor of a hybrid automobile or an electric car, or a vehicle attitude control system.

According to the mobile object as described above, excellent reliability is obtained.

Hereinbefore, the resonator element, the resonator, the oscillator, the electronic apparatus, the sensor, and the mobile object according to the invention have been described with reference to the embodiments shown in the drawings, but the invention is not limited thereto. The configuration of each part may be replaced with an arbitrary configuration having the same function. Further, other arbitrary configurations may be added to the invention. Further, the above-described embodiments may be appropriately combined.

Further, for example, in the above-described embodiments and modification examples, the quartz crystal is used as the material of the vibrating substrate of the resonator element, but instead, a piezoelectric material may be used. For example, as the vibrating substrate of the resonator element, an oxide substrate made of aluminum nitride (AlN), lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), or the like, a laminated piezoelectric substrate obtained by laminating a piezoelectric material such as aluminum nitride or tantalum pentoxide ($Ta_2O_5$) on a glass substrate, piezoelectric ceramics, or the like may be used.

In addition, the resonator element may be formed of a material other than the piezoelectric material. For example, the resonator element may be formed of a silicon semiconductor material or the like. Further, a vibration (driving) method of the resonator element is not limited to piezoelectric driving. For example, in the invention, as the driving method of the resonator element, electrostatic driving using an electrostatic force, Lorentz driving using a magnetic force, or the like, instead of the piezoelectric driving using the piezoelectric substrate, may be used.

In addition, the resonator element according to the invention may be applied to various sensors such as a gyro sensor, a pressure sensor, an acceleration sensor, or an inclination sensor.

In addition, the width reduction portion provided in the base is not limited to the shapes, the sizes, or the like of the above-described embodiments as long as the width is gradually reduced as it becomes distant from the central portion of the base. For example, the width of the width reduction portion may be changed in stages (for example, in a stepped shape).

The entire disclosure of Japanese Patent Application No. 2013-273529, filed Dec. 27, 2013 is expressly incorporated by reference herein.

What is claimed is:

1. A resonator element comprising:
a base that includes a first end portion and a second end portion disposed opposite to the first end portion in a planar view; and
a pair of vibrating arms that extends from the first end portion in a first direction and is arranged in a second direction intersecting with the first direction in the planar view,
wherein a protruding portion is provided in at least one end portion between a third end portion and a fourth end portion that are respectively disposed at opposite ends of the base in the second direction in the planar view, and
wherein when a shortest distance between the first end portion and the second end portion is Wb [m], an effective width of the base in the first direction is We [m], and a Q value of the resonator element is Q, the following expressions (A) and (B) are satisfied:

$$Q=\{(\rho \cdot Cp)/(c \cdot \alpha^2 \cdot \Theta)\} \times [\{1+(2 \cdot \rho Cp \cdot We^2 \cdot f/(\pi \cdot k))^2\}/ (2 \cdot \rho \cdot Cp \cdot We^2 \cdot f/(\pi \cdot k))] \quad \text{(A)}$$

$$0.81 \leq Wb/We \leq 1.70 \quad \text{(B)}$$

where in expression (A), f represents a vibration frequency [Hz] of the resonator element, $\rho$ is mass density [kg/m$^3$], Cp is thermal capacity [J/(kg·K)], c is an elastic constant [N/m$^2$] in a direction orthogonal to the direction of Wb in a plane, $\alpha$ is a thermal expansion coefficient [1/K] in the direction orthogonal to the direction of Wb in the plane, $\Theta$ is environmental temperature [K], and k is thermal conductivity [W/(m·K)] in the direction of Wb.

2. The resonator element according to claim 1, wherein a relationship of $0.91 \leq Wb/We \leq 1.30$ is satisfied.

3. The resonator element according to claim 2, wherein a relationship of $1.00 \leq Wb/We \leq 1.20$ is satisfied.

4. The resonator element according to claim 1, further comprising:
a supporting arm that extends from the base.

5. The resonator element according to claim 4, wherein the supporting arm is disposed between one pair of vibrating arms in the planar view.

6. The resonator element according to claim 1, wherein the vibrating arm includes a weight portion and an arm portion disposed between the weight portion and the base in the planar view.

7. The resonator element according to claim 6, wherein the weight portion has a width in the second direction wider than that of the arm portion.

8. The resonator element according to claim 7, wherein when a virtual line that passes through the center between one pair of vibrating arms along the first direction in the planar view is set, a distance between the virtual line and a tip end of the protruding portion is shorter than a distance between the virtual line and an end portion of the weight portion opposite to the virtual line in the second direction in the planar view.

9. A resonator comprising:
the resonator element according to claim 1; and
a container to which the resonator element is attached.

10. A resonator comprising:
the resonator element according to claim 2; and
a container to which the resonator element is attached.

11. The resonator according to claim 9, wherein the resonator element is attached to the container using an adhesive or a bump.

12. The resonator according to claim 10,
wherein the resonator element is attached to the container using an adhesive or a bump.

13. An oscillator comprising:
the resonator element according to claim 1; and
a circuit.

14. An oscillator comprising:
the resonator element according to claim 5; and
a circuit.

15. An electronic apparatus comprising the resonator element according to claim 1.

16. An electronic apparatus comprising the resonator element according to claim 2.

17. A sensor comprising the resonator element according to claim 1.

18. A sensor comprising the resonator element according to claim 2.

19. A mobile object comprising the resonator element according to claim 1.

20. A mobile object comprising the resonator element according to claim 2.

\* \* \* \* \*